(12) United States Patent
Hsieh et al.

(10) Patent No.: US 12,132,073 B2
(45) Date of Patent: *Oct. 29, 2024

(54) LIGHT-EMITTING DEVICE

(71) Applicant: EPISTAR CORPORATION, Hsinchu (TW)

(72) Inventors: Min Hsun Hsieh, Hsinchu (TW); Hsin-Mao Liu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/465,733

(22) Filed: Sep. 12, 2023

(65) Prior Publication Data

US 2023/0420484 A1 Dec. 28, 2023

Related U.S. Application Data

(60) Continuation of application No. 17/659,634, filed on Apr. 18, 2022, now Pat. No. 11,791,370, which is a (Continued)

(51) Int. Cl.
*H01L 31/12* (2006.01)
*G09G 3/32* (2016.01)
*H01L 27/15* (2006.01)
*H01L 33/48* (2010.01)
*H01L 33/50* (2010.01)
(Continued)

(52) U.S. Cl.
CPC .......... *H01L 27/156* (2013.01); *G09G 3/32* (2013.01); *H01L 27/15* (2013.01); *H01L 33/486* (2013.01); *H01L 33/507* (2013.01); *H01L 33/56* (2013.01); *H01L 33/62* (2013.01); *H01L 33/385* (2013.01); *H01L 33/44* (2013.01); *H01L 2224/24* (2013.01); *H01L 2933/0033* (2013.01);
(Continued)

(58) Field of Classification Search
CPC ......... H01L 31/12; H01L 27/32; H01L 33/00; H01L 33/08; H01L 27/15; H01L 51/50
See application file for complete search history.

(56) References Cited

U.S. PATENT DOCUMENTS

| 5,928,793 A | 7/1999 | Kimura |
| 6,039,631 A | 3/2000 | Sato et al. |

(Continued)

FOREIGN PATENT DOCUMENTS

| CN | 1750280 A | 3/2006 |
| CN | 2896325 Y | 5/2007 |

(Continued)

*Primary Examiner* — Mohammad M Choudhry
(74) *Attorney, Agent, or Firm* — MUNCY, GEISSLER, OLDS & LOWE, P.C.

(57) ABSTRACT

A light-emitting module including a first optoelectronic unit having a first electrode pad and a second electrode pad, a second optoelectronic unit having a third electrode pad and a fourth electrode pad, a first supporting structure enclosing the first optoelectronic unit and the second optoelectronic unit, a first pin overlapping and confronted with both of the first electrode pad and the third electrode pad, a second pin overlapping the second electrode pad and the first supporting structure, and a third pin overlapping the fourth electrode pad and physically separated from the second pin.

20 Claims, 26 Drawing Sheets

Related U.S. Application Data continuation of application No. 16/160,653, filed on Oct. 15, 2018, now Pat. No. 11,309,350, which is a continuation of application No. 15/167,131, filed on May 27, 2016, now Pat. No. 10,134,804, which is a division of application No. 13/845,796, filed on Mar. 18, 2013, now Pat. No. 9,356,070.

(60) Provisional application No. 61/683,295, filed on Aug. 15, 2012.

(51) Int. Cl.
   *H01L 33/56* (2010.01)
   *H01L 33/62* (2010.01)
   *H01L 33/38* (2010.01)
   *H01L 33/44* (2010.01)

(52) U.S. Cl.
   CPC ...... *H01L 2933/0041* (2013.01); *H01L 2933/005* (2013.01); *H01L 2933/0066* (2013.01)

(56) References Cited

U.S. PATENT DOCUMENTS

| | | | |
|---|---|---|---|
| 6,664,127 | B2 | 12/2003 | Oka et al. |
| 6,737,983 | B1 | 5/2004 | Temple |
| 7,625,099 | B2 | 12/2009 | Newton et al. |
| 7,709,849 | B1 | 5/2010 | Kal et al. |
| 7,932,523 | B2 | 4/2011 | Yatsuda et al. |
| 8,075,151 | B2 | 12/2011 | Ito et al. |
| 8,115,370 | B2 | 2/2012 | Huang |
| 8,188,585 | B2 | 5/2012 | Brunnbauer et al. |
| 9,261,246 | B2 | 2/2016 | Ogata et al. |
| 2002/0067425 | A1 | 6/2002 | Iverson |
| 2003/0067425 | A1 | 4/2003 | Tokunaga et al. |
| 2003/0094605 | A1 | 5/2003 | Preston et al. |
| 2003/0231842 | A1 | 12/2003 | Kropp |
| 2004/0266058 | A1 | 12/2004 | Lee et al. |
| 2005/0017268 | A1 | 1/2005 | Tsukamoto et al. |
| 2005/0053336 | A1 | 3/2005 | Ito et al. |
| 2005/0121764 | A1 | 6/2005 | Mallik et al. |
| 2006/0055309 | A1 | 3/2006 | Ono et al. |
| 2006/0147346 | A1 | 7/2006 | Bouten et al. |
| 2007/0138484 | A1 | 6/2007 | Yamamoto et al. |
| 2007/0177075 | A1 | 8/2007 | Kimoto |
| 2007/0252167 | A1* | 11/2007 | Chen ............. H04N 23/56 348/E5.029 |
| 2008/0123355 | A1 | 5/2008 | Wuu et al. |
| 2008/0290353 | A1 | 11/2008 | Medendorp, Jr. et al. |
| 2009/0052158 | A1 | 2/2009 | Bierhuizen et al. |
| 2009/0085052 | A1 | 4/2009 | Ko et al. |
| 2009/0108286 | A1 | 4/2009 | Lin et al. |
| 2009/0114928 | A1 | 5/2009 | Messere et al. |
| 2009/0224266 | A1 | 9/2009 | Wang et al. |
| 2010/0002414 | A1 | 1/2010 | Meir et al. |
| 2010/0151604 | A1 | 6/2010 | Kal et al. |
| 2010/0171133 | A1 | 7/2010 | Yanashima et al. |
| 2010/0171215 | A1 | 7/2010 | Fischer et al. |
| 2010/0259920 | A1 | 10/2010 | Lin |
| 2010/0283062 | A1 | 11/2010 | Hsieh et al. |
| 2010/0314639 | A1 | 12/2010 | Taniguchi et al. |
| 2010/0317132 | A1 | 12/2010 | Rogers et al. |
| 2011/0019433 | A1 | 1/2011 | Dussault |
| 2011/0025190 | A1 | 2/2011 | Jagt |
| 2011/0050073 | A1 | 3/2011 | Huang |
| 2011/0109596 | A1 | 5/2011 | Yoon |
| 2011/0169040 | A1 | 7/2011 | Seo et al. |
| 2011/0175131 | A1 | 7/2011 | Seo et al. |
| 2011/0182775 | A1 | 7/2011 | Kitamura |
| 2011/0193479 | A1 | 8/2011 | Nilssen et al. |
| 2011/0204390 | A1 | 8/2011 | Lerman et al. |
| 2011/0220871 | A1 | 9/2011 | Kamikawa et al. |
| 2011/0227111 | A1 | 9/2011 | Choi et al. |
| 2011/0262504 | A1 | 10/2011 | Deleersnyder et al. |
| 2011/0291145 | A1 | 12/2011 | Han et al. |
| 2011/0297979 | A1 | 12/2011 | Diana et al. |
| 2011/0303926 | A1 | 12/2011 | Erchak et al. |
| 2011/0316006 | A1 | 12/2011 | Xu |
| 2011/0317398 | A1 | 12/2011 | Moeck et al. |
| 2012/0056217 | A1 | 3/2012 | Jung et al. |
| 2012/0086023 | A1 | 4/2012 | Veerasamy et al. |
| 2012/0092389 | A1 | 4/2012 | Okuyama |
| 2012/0106125 | A1 | 5/2012 | Yokotani et al. |
| 2012/0193578 | A1 | 8/2012 | Pan et al. |
| 2012/0248497 | A1 | 10/2012 | Zhou et al. |
| 2012/0261551 | A1 | 10/2012 | Rogers |
| 2012/0267659 | A1 | 10/2012 | Chou et al. |
| 2013/0120990 | A1 | 5/2013 | Wu et al. |
| 2013/0193592 | A1 | 8/2013 | Peil et al. |
| 2014/0346532 | A1 | 11/2014 | Kim et al. |

FOREIGN PATENT DOCUMENTS

| | | |
|---|---|---|
| CN | 101504938 A | 8/2009 |
| CN | 201514954 U | 6/2010 |
| CN | 101809765 A | 8/2010 |
| CN | 201601149 U | 10/2010 |
| CN | 102074645 A | 5/2011 |
| CN | 201973530 U | 9/2011 |
| CN | 102330906 A | 1/2012 |
| CN | 102437276 A | 5/2012 |
| DE | 102008012844 A1 | 6/2009 |
| DE | 102009060759 A1 | 7/2011 |
| JP | H10319877 A | 12/1998 |
| JP | 2002157914 A | 5/2002 |
| JP | 2002261335 A | 9/2002 |
| JP | 2004106512 A | 4/2004 |
| JP | 2005302889 A | 10/2005 |
| JP | 2007523472 A | 8/2007 |
| JP | 2009188207 A | 8/2009 |
| JP | 2010199105 A | 9/2010 |
| JP | 2010205947 A | 9/2010 |
| JP | 2011070971 A | 4/2011 |
| JP | 2011082074 A | 4/2011 |
| JP | 2011129661 A | 6/2011 |
| JP | 2012028232 A | 2/2012 |
| JP | 2012151078 A | 8/2012 |
| JP | 5016400 B2 | 9/2012 |
| TW | I398026 B | 6/2013 |
| WO | 2004019422 A1 | 3/2004 |
| WO | 2011002208 A2 | 1/2011 |
| WO | 2011080058 A1 | 7/2011 |
| WO | 2011098135 A1 | 8/2011 |
| WO | 2012016525 A1 | 2/2012 |
| WO | 2012090966 A1 | 7/2012 |

* cited by examiner

LIGHT-EMITTING DEVICE

CROSS REFERENCE TO RELATED APPLICATIONS

This application is a continuation application of co-pending U.S. application Ser. No. 17/659,634 filed on Apr. 18, 2022, which is a continuation of co-pending U.S. application Ser. No. 16/160,653 filed on Oct. 15, 2018 which issued as U.S. Pat. No. 11,309,350 on Oct. 15, 2018, which is a continuation of U.S. application Ser. No. 15/167,131 filed on May 27, 2016 which issued as U.S. Pat. No. 10,134,804 on Nov. 20, 2018, which is a divisional of application Ser. No. 13/845,796 filed on Mar. 18, 2013 which issued as U.S. Pat. No. 9,356,070 on May 31, 2016, for which priority is claimed under 35 U.S.C. § 120; and this application claims priority of U.S. Provisional Application No. 61/683,295, filed on Aug. 15, 2012; the entire contents of all of which are hereby incorporated by reference.

BACKGROUND OF THE INVENTION

Field of the Invention

The present disclosure relates to a light-emitting device, and in particular to a light-emitting device comprising a contact structure.

Brief Description of the Related Art

The light-emitting diodes (LEDs) of the solid-state lighting elements have the characteristics of the low power consumption, low heat generation, long operational life, shockproof, small volume, quick response and good opto-electrical property, for example, light emission with a stable wavelength, so the LEDs have been widely used in household appliances, indicator light of instruments, and opto-electrical products, etc. As the opto-electrical technology develops, the solid-state lighting elements have great progress in the light efficiency, operation life and the brightness, and LEDs are expected to become the main stream of the lighting devices in the coming future.

Recently, a display module comprising a plurality of LEDs as pixels has been developed. However, how to manufacture a LED pixel with smaller volume is still an issue in this field.

SUMMARY OF THE INVENTION

The present disclosure provides a light-emitting display module display. The light-emitting display module comprises: a board; and a plurality of light-emitting diode modules arranged in an array configuration on the board; wherein one of the light-emitting diode modules comprises a plurality of encapsulated light-emitting units spaced apart from each other; and one of the encapsulated light-emitting units comprises a plurality of optoelectronic units, a first supporting structure and a fence; and wherein the plurality of optoelectronic units are covered by the first supporting structure and the fence surrounding the first supporting structure and the plurality of optoelectronic units.

The present disclosure also provides an encapsulated light-emitting unit. The encapsulated light-emitting unit comprises: a plurality of optoelectronic units, each of which having a bottom side and comprising a first pad and a second pad which are formed on the bottom side; a first supporting structure enclosing the plurality of the optoelectronic units to expose the first pads and the second pads; and a fence surrounding the first supporting structure and the plurality of the optoelectronic units without covering the bottom sides.

BRIEF DESCRIPTION OF THE DRAWINGS

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1A:
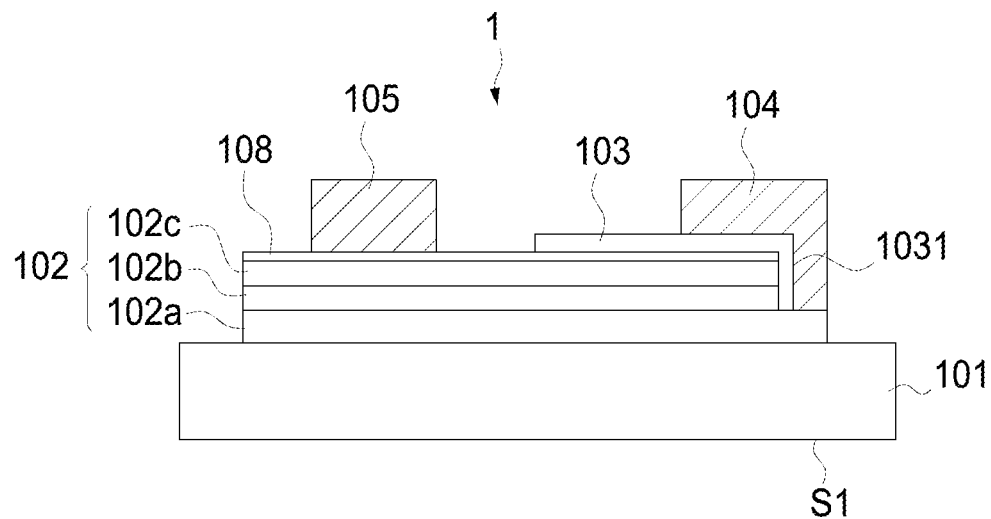
FIG. 1A illustrates a cross-sectional view of an optoelectronic unit disclosed in one embodiment of the present application.
Figure 1B:
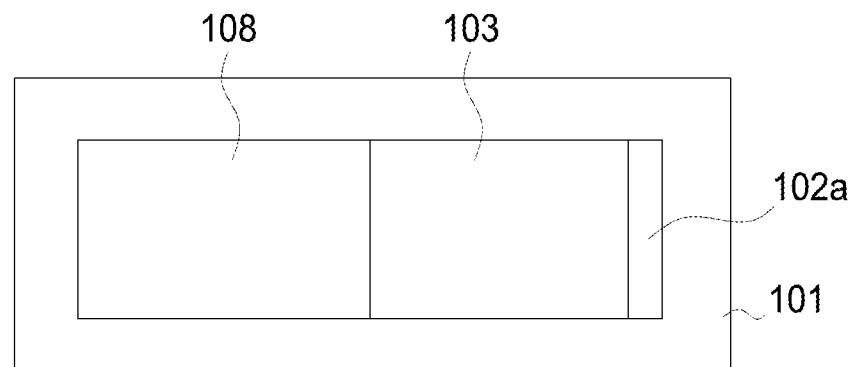
FIG. 1B illustrates a top view of the optoelectronic unit of FIG. 1A without showing a bonding pad.
Figure 1C:
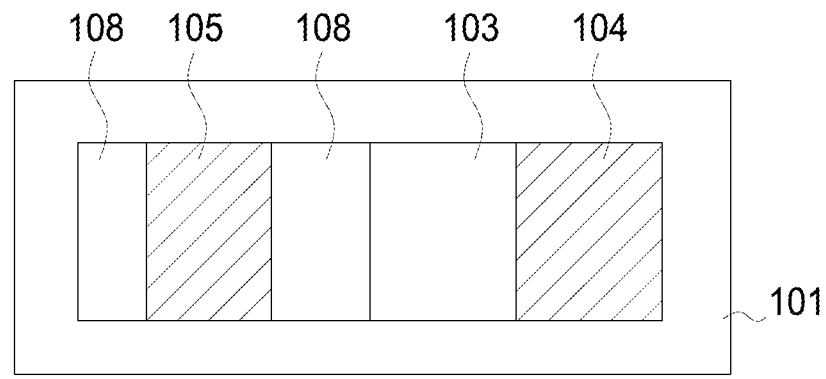
FIG. 1C illustrates a top view of the optoelectronic unit of FIG. 1A.

FIG. 1A illustrates a cross-sectional view of an optoelectronic unit 1 disclosed in one embodiment of the present application. The optoelectronic unit 1 has a bottom surface S1 with an area smaller than 50 mil$^2$, for example, the area is about 4 mil×6 mil or 2 mil×5 mil. The optoelectronic unit 1 includes a substrate 101 with the bottom surface S1 and a light-emitting structure 102 formed on the substrate 101 opposite to the bottom surface S1. The light-emitting structure 102 includes a first semiconductor layer 102a having a first polarity; a second semiconductor layer 102c having a second polarity; and a light-emitting layer 102b formed between the first semiconductor layer 102a and the second semiconductor layer 102c. The first and second semiconductor layers 102a, 102b respectively provide electrons and holes such that electrons and holes can be combined in the light-emitting layer 102b to emit light. The material of the light-emitting structure 102 comprises III-V group semiconductor material. Depending on the material of the light-emitting layer 102b, the optoelectronic unit 1 is capable of emitting a red light, a green light, or a blue light. A first passivation layer 103 is formed on one or more surfaces of the light-emitting structure 102 and is made of one or more dielectric materials such as $SiO_2$ or $Si_3N_4$. A transparent conductive layer 108 made of a conductive material, such as indium tin oxide (ITO), cadmium tin oxide (CTO), antimony tin oxide, indium zinc oxide, zinc aluminum oxide, or zinc tin oxide, is formed on the second semiconductor layer 102c of the light-emitting structure 102 for current spreading. A first bonding pad 104 is formed on the first passivation layer 103 and electrically connected to the first semiconductor layer 102a. A second bonding pad 105 is formed on the light-emitting structure 102 and electrically connected to the second semiconductor layer 102c through the transparent conductive layer 108. The first passivation layer 103 is used to avoid short circuit between the first bonding pad 104 and the second bonding pad 105 through the transparent conductive layer 108. In this embodiment, the first passivation layer 103 has an extension portion 1031 covering a sidewall of the light-emitting layer 102b, the second semiconductor layer 102c and the transparent conductive layer 108. The first bonding pad 104 covers the extension portion 1031 of the first passivation layer 103. Each of the first passivation layer 103 and the first bonding pad 104 has an L-shape in cross-sectional view. FIG. 1B illustrates a top view of the optoelectronic unit 1 without showing the first bonding pad 104 and the second bonding pad 105 of FIG. 1A. The passivation layer 103 is formed on and covers substantially a half of an area of the transparent conductive layer 108. A portion of the first semiconductor layer 102a is exposed for electrically connecting with the first binding pad 104. FIG. 1C illustrates a top view of the optoelectronic unit 1 as shown in FIG. 1A.

Figure 2A:
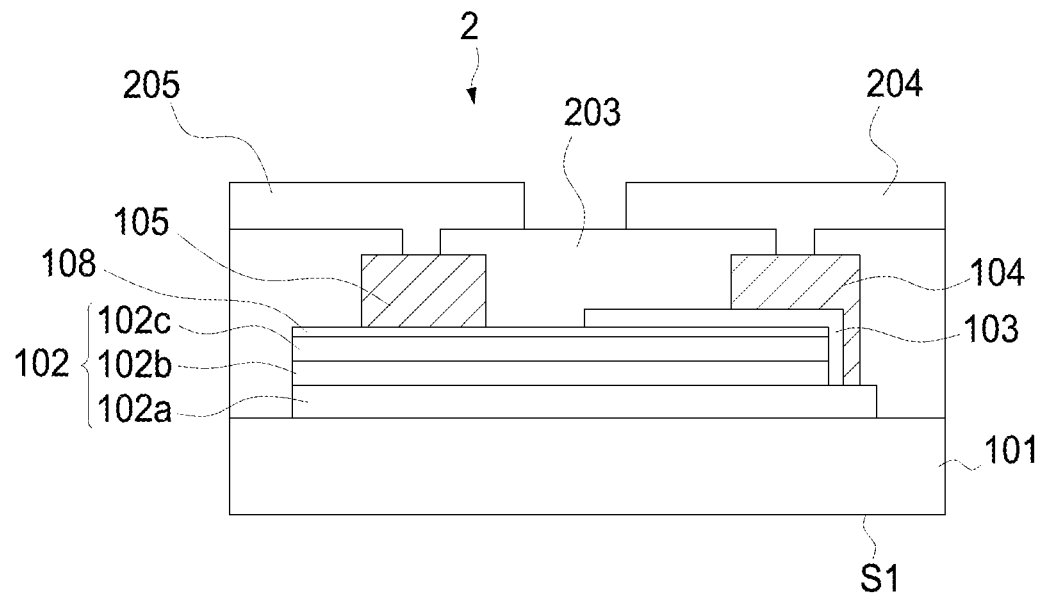
FIG. 2A illustrates a cross-sectional view of an optoelectronic unit disclosed in one embodiment of the present application.
Figure 2B:
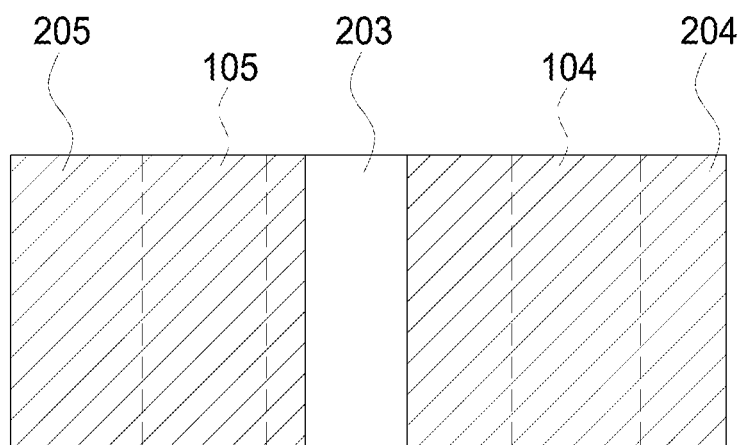
FIG. 2B illustrates a top view of the optoelectronic unit of FIG. 2A.

FIG. 2A illustrates a cross-sectional view of an optoelectronic unit 2 disclosed in one embodiment of the present application. The optoelectronic unit 2 has a bottom surface S1 with an area smaller than 50 mil$^2$, for example, the area is about 4 mil×6 mil or 2 mil×5 mil. As shown in FIG. 2A, other than the parts similar to the optoelectronic unit 1, the optoelectronic unit 2 further includes a first extension pad 204, a second extension pad 205, and a second passivation layer 203. The first extension pad 204 and the second extension pad 205 can be respectively formed on the first bonding pad 104 and the second bonding pad 105, for electrically connecting therebetween. The second passivation layer 203 which can be made of one or more dielectric materials, such as $SiO_2$ and/or $Si_3N_4$, is used to physically separate the first extension pad 204 and the second extension pad 205 from each other. FIG. 2B illustrates a top view of the optoelectronic unit 2 of FIG. 2A. The first extension pad 204 is larger than the first bonding pad 104. The second extension pad 205 is larger than the second bonding pad 105.

Figure 3A:
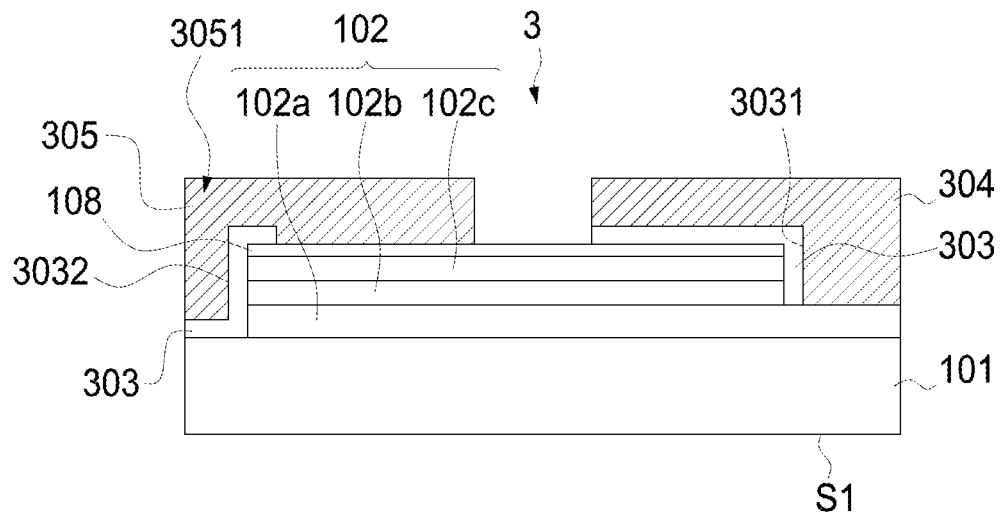
FIG. 3A illustrates a cross-sectional view of an optoelectronic unit disclosed in one embodiment of the present application.
Figure 3B:
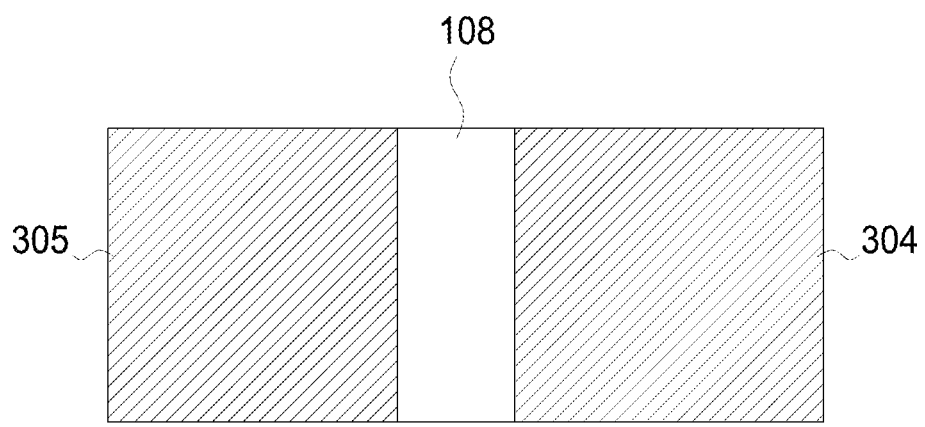
FIG. 3B illustrates a top view of the optoelectronic unit of FIG. 3A.

FIG. 3A illustrates a cross-sectional view of an optoelectronic unit 3 disclosed in one embodiment of the present application. The optoelectronic unit 3 has a bottom surface S1 with an area smaller than 50 mil$^2$, for example, the area is about 4 mil×6 mil or 2 mil×5 mil. As shown in FIG. 3A, the optoelectronic unit 3 includes a substrate 101 with the bottom surface S1 and a light-emitting structure 102 formed on the substrate 101. The light-emitting structure 102 includes a first semiconductor layer 102a having a first polarity, a second semiconductor layer 102c having a second polarity and a light-emitting layer 102b formed between the first semiconductor layer 102a and the second semiconductor layer 102c. The first and second semiconductor layers 102a, 102b respectively provide electrons and holes such that electrons and holes can be combined in the light-emitting layer 102b to emit light. The material of the light-emitting structure 102 comprises III-V group semiconductor material. Depending on the material of the light-emitting layer 102b, the optoelectronic unit 3 is capable of emitting a red light, a green light, or a blue light. The optoelectronic unit 3 further includes a passivation layer 303 formed on one or more surfaces of the light-emitting structure 102 wherein the passivation layer 303 is made of one or more dielectric materials such as $SiO_2$ and/or $Si_3N_4$. A transparent conductive layer 108 made of a conductive material such as indium tin oxide (ITO), cadmium tin oxide (CTO), antimony tin oxide, indium zinc oxide, zinc aluminum oxide, and/or zinc tin oxide, is formed on the light-emitting structure 102 for current spreading. A first electrode pad 304 and a second electrode pad 305 are formed on the same side of the substrate 101 and electrically connected to the first semiconductor layer 102a and the second semiconductor layer 102c, respectively. The first electrode pad 304 and the second electrode pad 305 are electrically and physically separated from each other. In this embodiment, the passivation layer 303 has a first extension portion 3031 covering a sidewall of the light-emitting layer 102b, the second semiconductor layer 102c and the transparent conductive layer 108. The passivation layer 303 further has a second extension portion 3032 covering a sidewall of the light-emitting layer 102b, the first and second semiconductor layer 102a, 102c and the transparent conductive layer 108. The first electrode pad 304 covers the first extension portion 3031 of the third passivation layer 303. The second electrode pad 305 covers the second extension portion 3032 of the third passivation layer 303. Each of the first electrode pad 304 and the second electrode pad 305 has an L-shape in cross-sectional view. FIG. 3B illustrates a top view of the optoelectronic unit 3 of FIG. 3A.

The first bonding pad 104 and the second bonding pad 105, as shown in FIG. 1C, can function as an electrical connection path to an external power supply (not shown). The first extension pad 204 and the second extension pad 205, as shown in FIG. 2B, or the first electrode pad 304 and the second electrode pad 305, as shown in FIG. 3B, can function similarly to the first bonding pad 104 and the second bonding pad 105, respectively. Taking the first bonding pad 104 as an example, if the top surface area of the first bonding pad 104 is larger enough, it would be easier to connect or align the optoelectronic unit 1 to an external structure, for example, the external power supply. The first extension pad 204 formed on the first bonding pad 104 can further enlarge connection area so that the optoelectronic unit 2 can have even larger alignment tolerance than the optoelectronic unit 1. Accordingly, the area of the top surface of the first electrode pad 304 can be approximately similar to that of the top surface of the first extension pad 204, and the area of the top surface of the second electrode pad 305 can also be approximately similar to that of the top surface of the second extension pad 205.

Figure 4A:
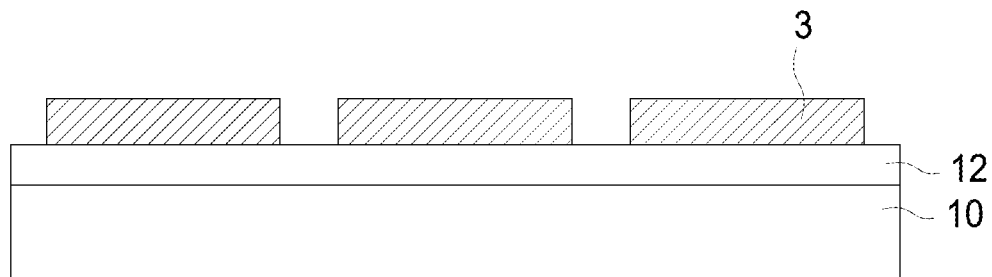
FIGS. 4A-4C illustrates a manufacturing method of an optoelectronic element disclosed in one embodiment of the present application.
Figure 4B:
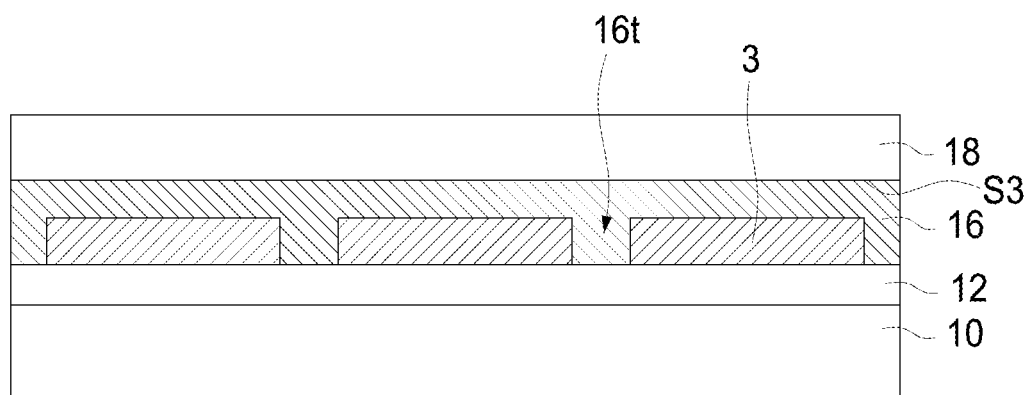
Figure 4C:
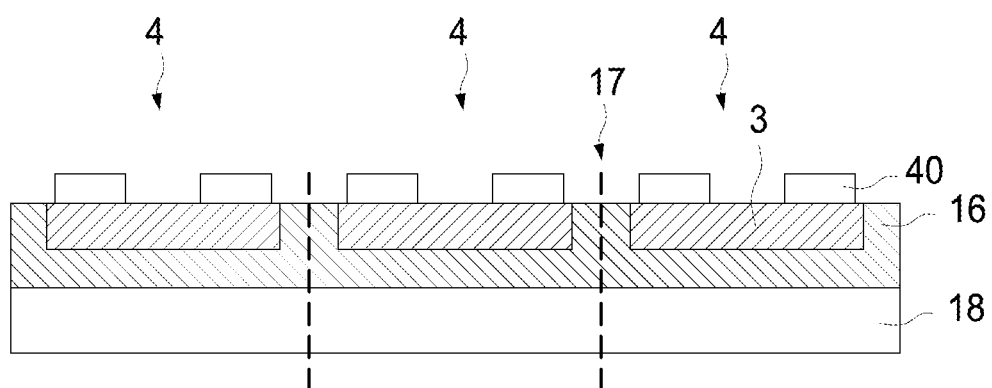

FIGS. 4A-4C illustrate steps of making a plurality of optoelectronic elements 4. As shown in FIG. 4A, a plurality of optoelectronic units, which can be one or more kinds of the optoelectronic units 1, 2, and 3 as disclosed in the previous embodiments, can be provided on a temporary carrier 10. The material of the temporary carrier 10 can include at least one of conductive material and insulating material. The conductive material includes carbonaceous material, composite, metal, semiconductor, or any combination thereof. The carbonaceous material is such as Diamond Like Carbon (DLC), graphite, or carbon fiber. The composite is such as Metal Matrix Composite (MMC), Ceramic Matrix Composite (CMC) and/or Polymer Matrix Composite (PMC). The semiconductor is such as Si, ZnSe, GaAs, SiC, GaP, GaAsP, ZnSe, InP, LiGaO$_2$, or LiAlO$_2$. The metal is such as Ni, Cu, or Al. The insulating material includes organic material, inorganic material, and any combination thereof. The organic material is such as epoxy, polyimide (PI), BCB, perfluorocyclobutane (PFCB), Su8, crylic resin, polymethyl methacrylate (PMMA), polyethylene terephthalate (PET), polycarbonate (PC), polyetherimide, or fluorocarbon polymer. The inorganic material is such as sapphire, ZnO, diamond, glass, quartz, or AlN.

In FIGS. 4A-4C, taking the optoelectronic unit 3 as an example, a bonding layer 12 can be further provided to bond the plurality of optoelectronic units 3 to the temporary carrier 10. Each of the plurality of optoelectronic units 3 can include a light-emitting diode (LED) chip having a first electrode pad 304 and a second electrode pad 305, as shown in FIG. 3A, bonded to the bonding layer 12. The bonding layer 12 can include one or more adhesive materials. The adhesive material can be an insulating material, a UV tape, or a thermal release tape. The insulating material includes but not limited to benzocyclobutene (BCB), Su8, epoxy, or spin-on-glass (SOG).

After aforementioned steps, the optoelectronic units 3 can be encapsulated by a first supporting structure 16, as shown in FIG. 4B. The first supporting structure 16 can be a transparent structure, primarily constructed of one or more of organic material and inorganic material. The organic material can be epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, or fluorocarbon polymer. The inorganic material can be glass, Al$_2$O$_3$, SINR, or SOG. The first supporting structure 16 can be filled in a space 16t between two adjacent optoelectronic units 3. The first supporting structure 16 covering the optoelectronic units 3 can hold and support the optoelectronic units 3, and enhance the mechanical strength of the optoelectronic units 3. In addition, a surface S3 of the first supporting structure 16 can be a smooth surface or a rough surface. A second supporting structure 18 can be further formed on the first supporting structure 16 to strengthen the support of the optoelectronic unit 3 and the first supporting structure 16. The second supporting structure 18 includes one material different from that of the first supporting structure 16, or has hardness greater than that of the first supporting structure 16.

As shown in FIG. 4C, the temporary carrier 10 and the bonding layer 12 are removed to expose portions of the plurality of optoelectronic units 3 and the first supporting structure 16 after the first supporting structure 16 or the second supporting structure 18 is formed. A plurality of conductive structures 40, which are located on a position opposite to the second supporting structure 18, are then formed on the exposed portions of the plurality of optoelectronic units 3 and the first supporting structure 16. The conductive structure 40 can be connected to the first electrode pad 304 and the second electrode pad 305 of the optoelectronic unit 3, respectively, as shown in FIG. 3A. Each conductive structure 40 has a top surface area (not shown) greater than one of the first bonding pad 104 and the second bonding pad 105 (shown in FIG. 5A), or greater than or equal to one of the first extension pad 204 and the second extension pad 205 (shown in FIG. or greater than or equal to one of the first electrode pad 304 and the second electrode pad 305 (shown in FIG. 5C). Finally, the plurality of optoelectronic elements 4 is separated from each other by dicing along openings 17, as shown in FIG. 4C. At least one of the length, the width and/or the area of the optoelectronic element 4 is within the same order of the optoelectronic unit 1, 2 or 3.

Figure 5A:
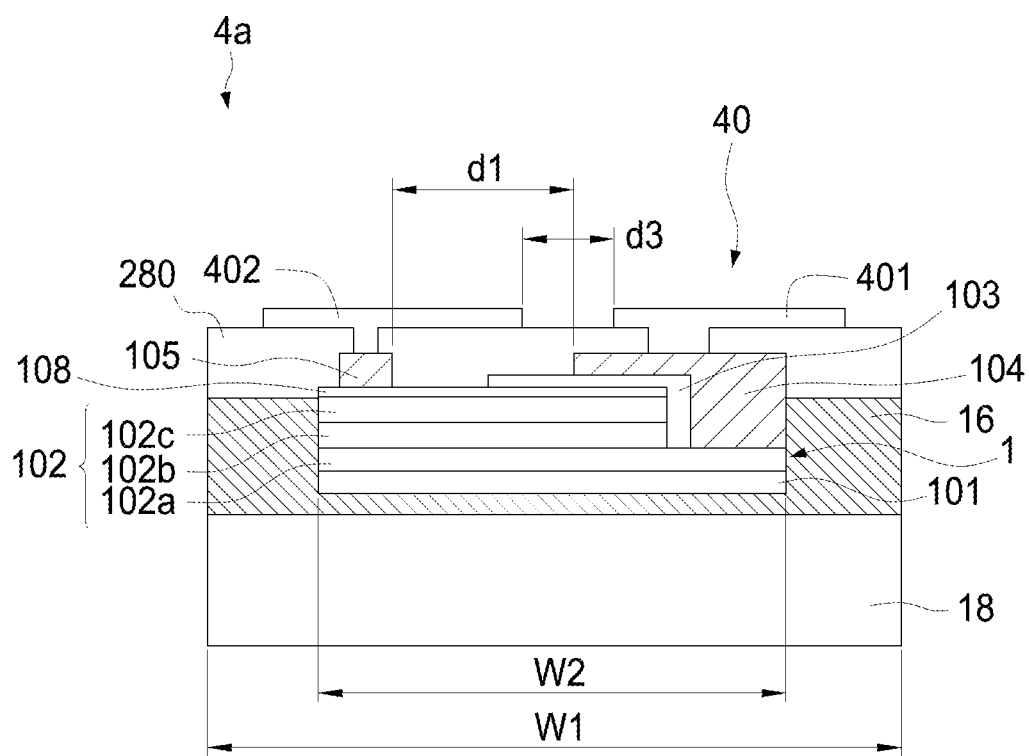
FIG. 5A illustrates a cross-sectional view of an optoelectronic element disclosed in one embodiment of the present application.

FIG. 5A illustrates a cross-sectional view of an optoelectronic element 4a, which is made with the process shown in FIGS. 4A to 4C. The optoelectronic element 4a includes an optoelectronic unit 1, a first supporting structure 16 formed to surround the optoelectronic unit 1, and a second supporting structure 18 formed on the first transparent structure 16. Preferably, the first supporting structure 16 can be formed in a shape surrounding the optoelectronic unit 1. The conductive structure 40 comprises a first conductive structure 401 and a second conductive structure 402 which are formed on the optoelectronic unit 1, and respectively connected to the first bonding pad 104 and the second bonding pad 105 of the optoelectronic unit 1. The area of the first conductive structure 401 is larger than that of the first bonding pad 104, and the area of the second conductive structure 402 is larger than that of the second bonding pad 105. The first passivation layer 103, which is disposed on the light-emitting structure 102, can physically isolate the first bonding pad 104 and the second bonding pad 105, and protect the light-emitting structure 102. A reflective layer 280 can be formed between the optoelectronic unit 1 and the conductive structure 40, and further formed on the first supporting structure 16. The reflective layer 280 can be made of one or more reflective materials such as dielectric material, for example, SiO$_2$, Si$_3$N$_4$, or metal oxide, such as titanium dioxide or other white substance. In an example of the present application, the reflective layer 280 can be a single layer or a stack. A ratio of a volume of the optoelectronic element 4a and a volume of the optoelectronic unit 1 is between 1.2:1 and 10:1, preferably between 2:1 and 5:1. The second supporting structure 18 has a first width W1. The optoelectronic unit 1 has a second width W2. The first width W1 is larger than the second width W2, for example, the first width W1 is at least 1.5 times the second width W2. The first bonding pad 104 is spaced apart from the second bonding pad 105 by a first distance (d1) and the first conductive structure 401 is spaced apart from the second conductive structure 402 by a third distance (d3). The first distance (d1) between the first bonding pad 104 and the second bonding pad 105 is larger than the third distance (d3) between the first conductive structure 401 and the second conductive structure 402.

Figure 5B:
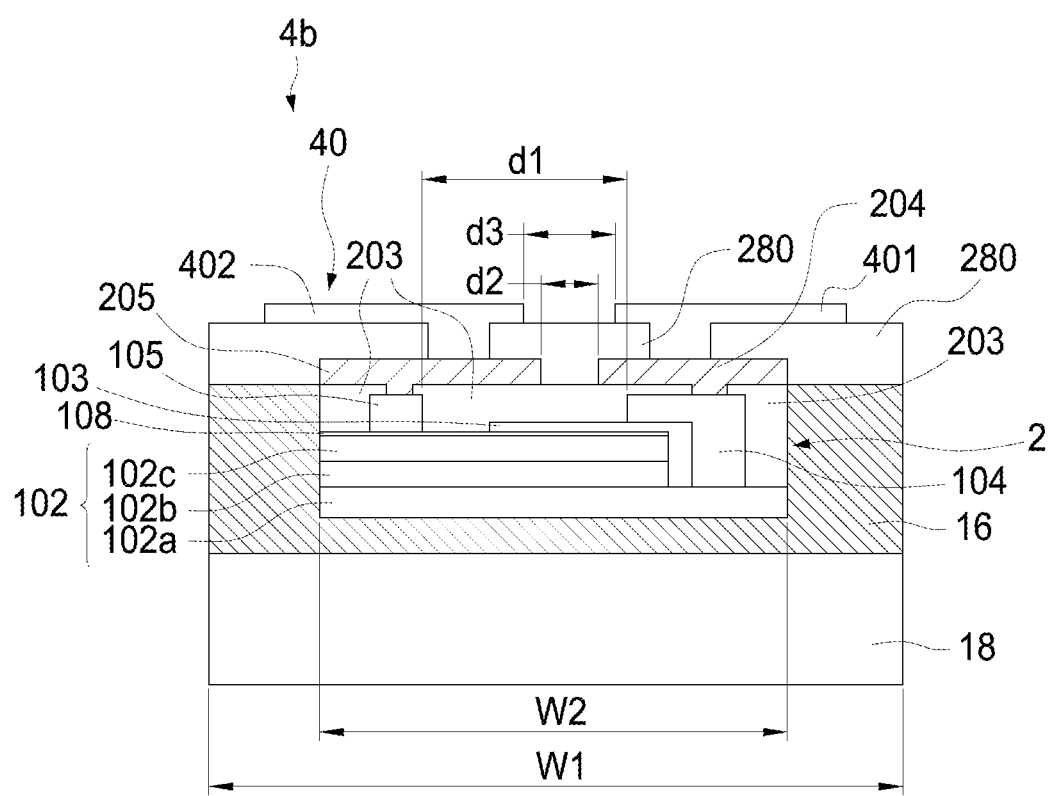
FIG. 5B illustrates a cross-sectional view of an optoelectronic element disclosed in one embodiment of the present application.

FIG. 5B illustrates a cross-sectional view of an optoelectronic element 4b, which is made with the process shown in FIGS. 4A to 4C. The optoelectronic element 4b includes an optoelectronic unit 2, a first supporting structure 16 formed on the optoelectronic unit 2, and a second supporting structure 18 formed on the first supporting structure 16. The first supporting structure 16 can be formed in a shape surrounding the optoelectronic unit 2. The conductive structure 40 comprises a first conductive structure 401 and a second conductive structure 402 are formed on the optoelectronic unit 2, and connected to the first extension pad 204 and the second extension pad 205, respectively. A reflective layer 280 can be formed on the optoelectronic unit 2 and the first supporting t structure 16. The reflective layer 280 can be made of one or more reflective materials such as dielectric material, for example, $SiO_2$, $Si_3N_4$, or metal oxide, such as titanium dioxide or other white substance. In an example of the present application, the reflective layer 280 can be a single layer or a stack. The first conductive structure 401 has an area larger than or equal to the first extension pad 204, and the second conductive structure 402 has an area larger than or equal to that of the second extension pad 205. A ratio of a volume of the optoelectronic element 4b and a volume of the optoelectronic unit 2 is between 1.2:1 and 10:1, preferably between 2:1 and 5:1. The second supporting structure 18 has a first width W1, and the optoelectronic unit 2 has a second width W2. The first width W1 is larger than the second width W2, for example, the first width W1 is at least 1.5 times the second width W2. The first bonding pad 104 is spaced apart from the second bonding pad 105 by a first distance (d1), the first extension pad 204 is spaced apart from the second extension pad 205 by a second distance (d2), and the first conductive structure 401 is spaced apart from the second conductive structure 402 by a third distance (d3). The first distance (d1) between the first bonding pad 104 and the second bonding pad 105 is larger than the second distance (d2) between the first extension pad 204 and the second extension pad 205, and further larger than the third distance (d3) between the first conductive structure 401 and the second conductive structure 402. However, FIG. 5B is only illustrative but not limitative. The second distance (d2) can be equal to, larger, or smaller than the third distance (d3).

Figure 5C:
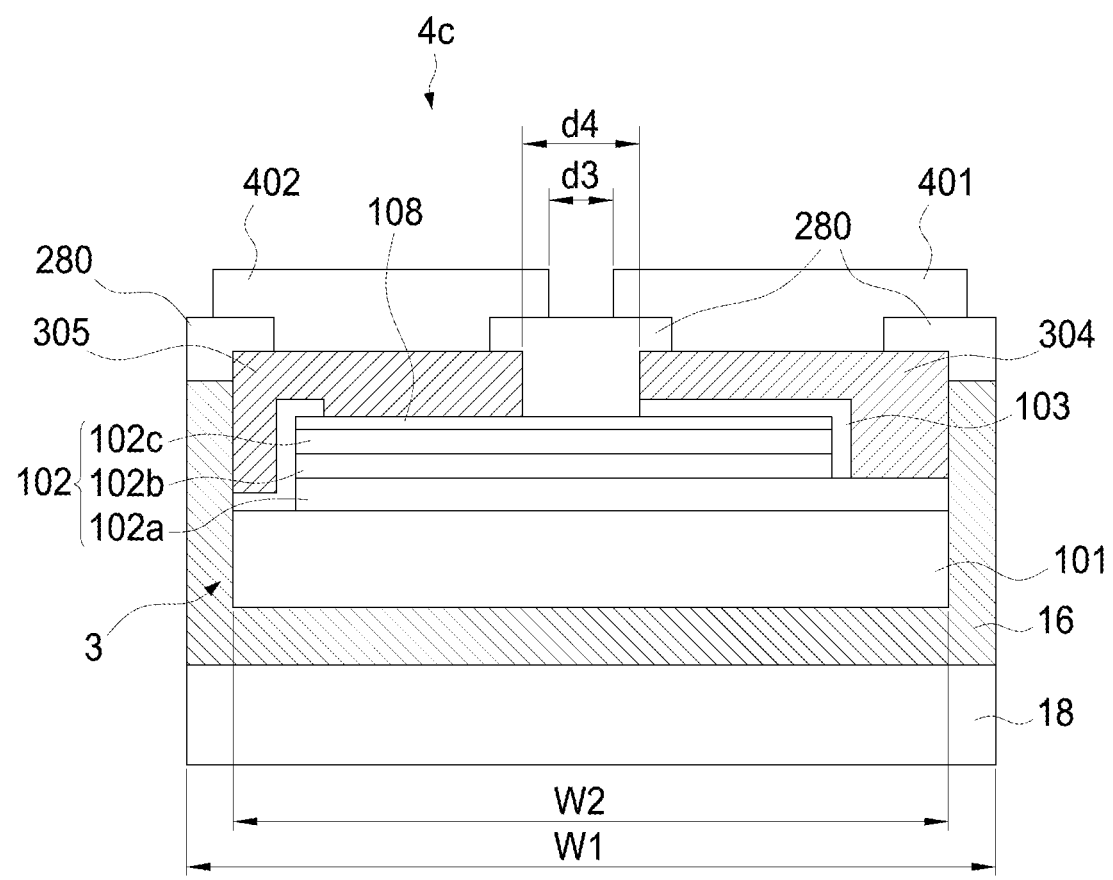
FIG. 5C illustrates a cross-sectional view of an optoelectronic element disclosed in one embodiment of the present application.

FIG. 5C illustrates a cross-sectional view of an optoelectronic element 4c, which is made with the process shown in FIGS. 4A to 4C. The optoelectronic element 4c includes an optoelectronic unit 3, a first supporting structure 16 formed on the optoelectronic unit 3, and a second supporting structure 18 formed on the first supporting structure 16. The optoelectronic unit 3 can be surrounded by the first supporting structure 16. A first conductive structure 401 and a second conductive structure 402 are formed on the optoelectronic unit 3, and connected to the first electrode pad 304 and the second electrode pad 305, respectively. A reflective layer 280 can be formed on the optoelectronic unit 3 and the first supporting structure 16. The reflective layer 280 can be made of one or more reflective materials such as dielectric material, for example, $SiO_2$, $Si_3N_4$, or metal oxide, such as titanium dioxide or other white substance. The first conductive structure 401 has an area larger than or equal to that of the first electrode pad 304, and the second conductive structure 402 has an area larger than or equal to that of the second electrode pad 305. A ratio of a volume of the optoelectronic element 4c and a volume of the optoelectronic unit 3 is between 1.2:1 and 10:1, preferably between 2:1 and 5:1. The second supporting structure 18 has a first width W1 and the optoelectronic unit 3 has a second width W2. The first width W1 is larger than the second width W2, for example, the first width W1 is at least 1.5 times the second width W2. The first electrode pad 304 is spaced apart from the second electrode pad 305 by a fourth distance (d4) and the first conductive structure 401 is spaced apart from the second conductive structure 402 by a third distance (d3). The fourth distance (d4) between the first electrode pad 304 and the second electrode pad 305 is larger than or equal to the third distance (d3) between the first conductive structure 401 and the second conductive structure 402. Nevertheless, FIG. 5C is only illustrative but not limitative.

Figure 6A:
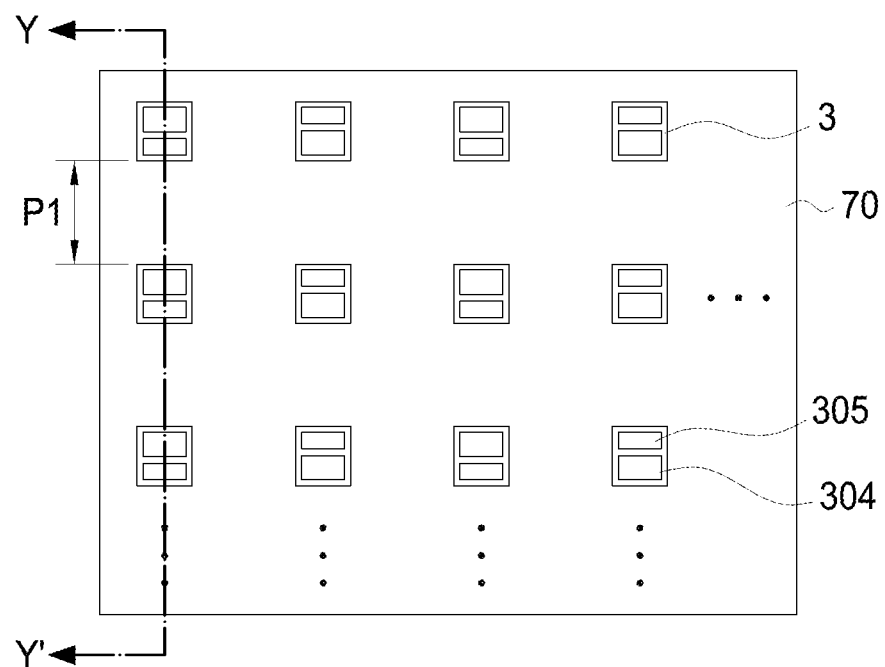
FIGS. 6A-6B, 7A-7B, 8, 9A-9B, 10A-10D, 11A-11B, 12A-12B, 13A-13B, and 14 illustrate a manufacturing method of a light-emitting device in accordance with an embodiment of the present application.
Figure 6B:
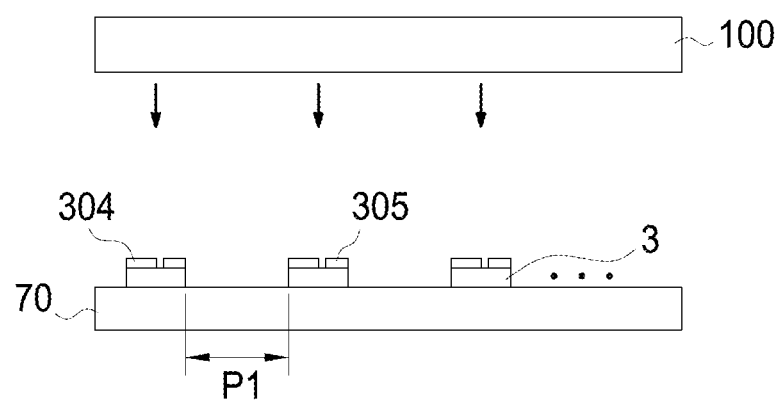

FIGS. 6A-10B illustrate steps of manufacturing an optoelectronic device in accordance with one embodiment of the present application. In FIGS. 6A-10B, the optoelectronic unit 3 is referred in the following description, but the steps can also be applied to one or more kinds of the optoelectronic units 1, and 2, or the optoelectronic elements 4a, 4b, or 4c described above. FIG. 6A illustrates a top view of a plurality of optoelectronic units 3 with a first electrode pad 304 and a second electrode pad 305 formed on a temporary substrate 70 with a first pitch P1. In another embodiment, the optoelectronic units can be grown on a growth substrate (not shown) with a first pitch P1. FIG. 6B illustrates a cross-sectional view along the line Y-Y' in FIG. 6A, and a temporary carrier 100 is provided for subsequent transfer. The optoelectronic units 3 are transferred to a temporary carrier 100. In details, the optoelectronic units 3 can be transferred from the temporary substrate 70 to predetermined positions of the temporary carrier 100 by manual pick-up or mechanical pick-up. Specifically, the optoelectronic units 3 can also be transferred to the temporary carrier 100 by an adhesive layer (not shown). Moreover, the optoelectronic units 3 can be transferred one by one, or in a batch.

Figure 7A:
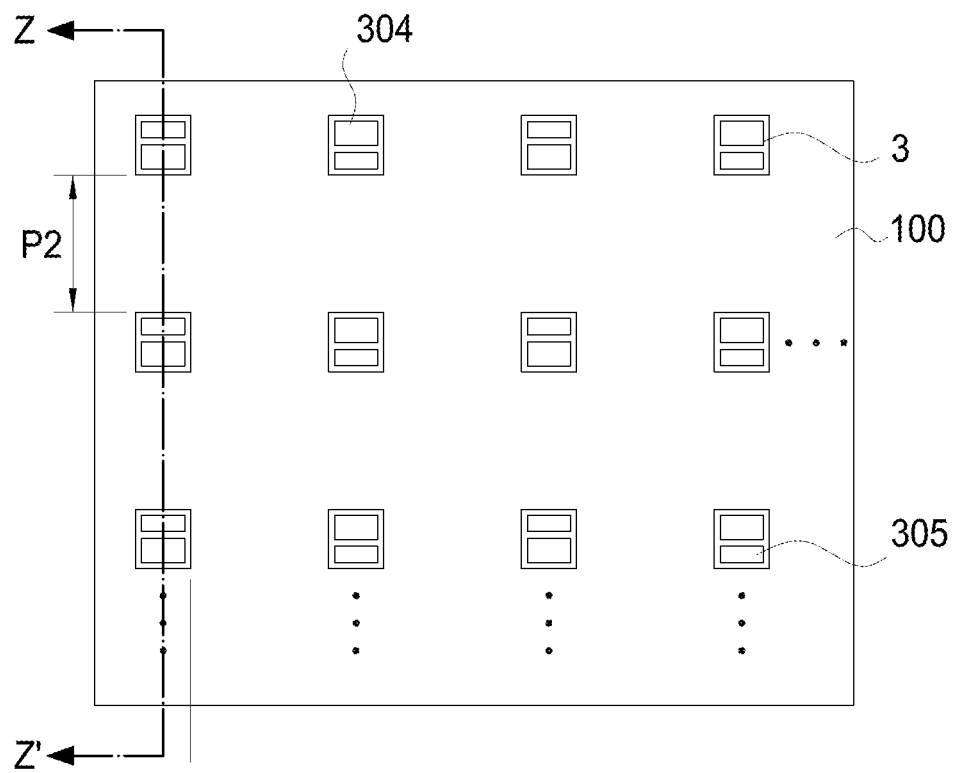
Figure 7B:
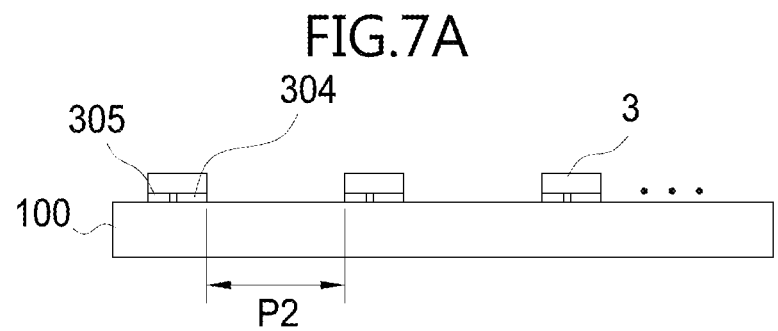
Figure 8:
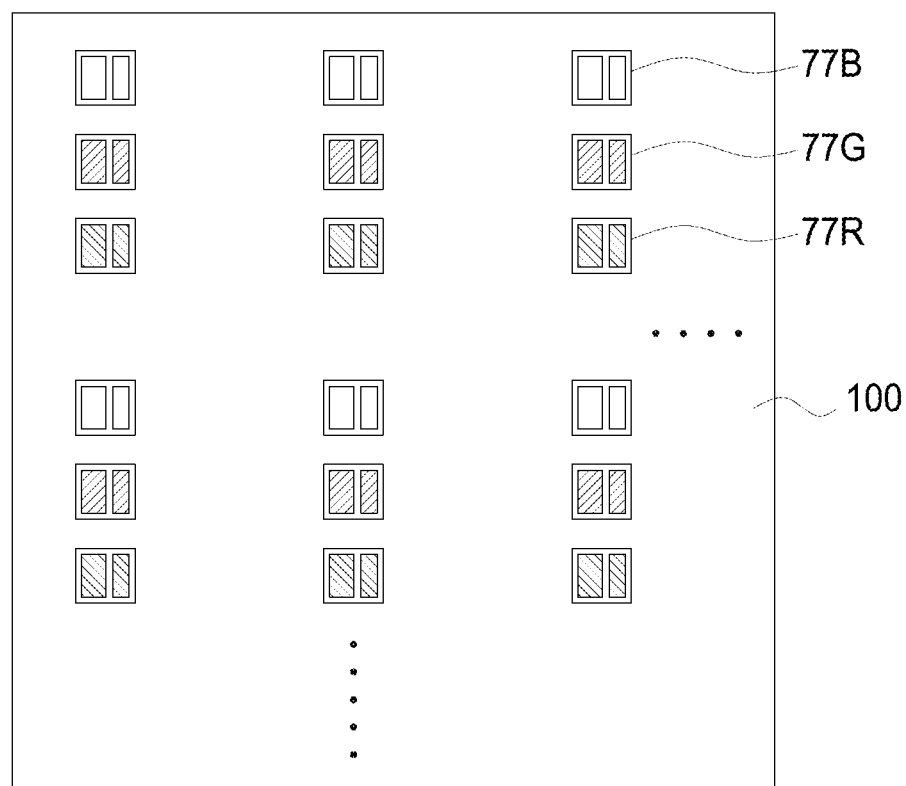

FIG. 7A illustrates a top view of a plurality of optoelectronic units 3 formed on a temporary carrier 100 in accordance with an embodiment of the present application. FIG. 7B illustrates a cross-sectional view along the line Z-Z' shown in FIG. 7A. FIG. 7B illustrates that the optoelectronic units 3 are transferred to the temporary carrier 100 from the temporary substrate 70 or the growth substrate (not shown) with a second pitch (P2). The temporary carrier 100 includes a material similar to that of the temporary carrier 10. The material of the temporary carrier 100 can include at least one of conductive material and insulating material. The conductive material includes carbonaceous material, composite, metal, semiconductor, or any combination thereof. The carbonaceous material is such as Diamond Like Carbon (DLC), graphite, or carbon fiber. The composite is such as Metal Matrix Composite (MMC), Ceramic Matrix Composite (CMC) and/or Polymer Matrix Composite (PMC). The semiconductor is such as Si, ZnSe, GaAs, SiC, GaP, GaAsP, ZnSe, InP, $LiGaO_2$, or $LiAlO_2$. The metal is such as Ni, Cu, or Al. The insulating material includes organic material, inorganic material, and any combination thereof. The organic material is such as epoxy, polyimide (PI), BCB, perfluorocyclobutane (PFCB), Su8, crylic resin, polymethyl methacrylate (PMMA), polyethylene terephthalate (PET), polycarbonate (PC), polyetherimide, or fluorocarbon polymer. The inorganic material is such as sapphire, ZnO, diamond, glass, quartz, or AlN. In an embodiment, the temporary carrier 100 can be a tape including one or more adhesive materials to connect the optoelectronic units. The optoelectronic units 3 are formed on the temporary carrier 100 with the second pitch P2 which is larger than the first pitch P1, that is, a space between two adjacent optoelectronic units is enlarged when the optoelectronic units are transferred to the temporary carrier 100 from the temporary substrate 70. Accordingly, other optoelectronic units can be positioned in the enlarged space. For example, as shown in FIG. 8, a first plurality of optoelectronic units 77B, which emits blue light, is transferred to the temporary carrier 100, and since the space between two adjacent optoelectronic units 77B is enlarged such that a second plurality of optoelectronic units 77G, which emits green light, and (or) a third plurality of optoelectronic units 77R, which emits red light, can be disposed on (or transferred to) the temporary carrier 70 at appropriate distance by the method illustrated in FIGS. 6A-7B, respectively. Therefore, The optoelectronic units 77B, 77R, 77G can be arranged in a repeated blue-green-red pattern. In another embodiment, the sequence and the amount of the optoelectronic units 77B, 77G, 77R can be adjusted. At least one optoelectronic unit of the first plurality of optoelectronic units 77B, the second plurality of optoelectronic units 77G, and the third plurality of optoelectronic units 77R can have a structure similar to that of the optoelectronic units 1, 2 or 3.

Figure 9A:
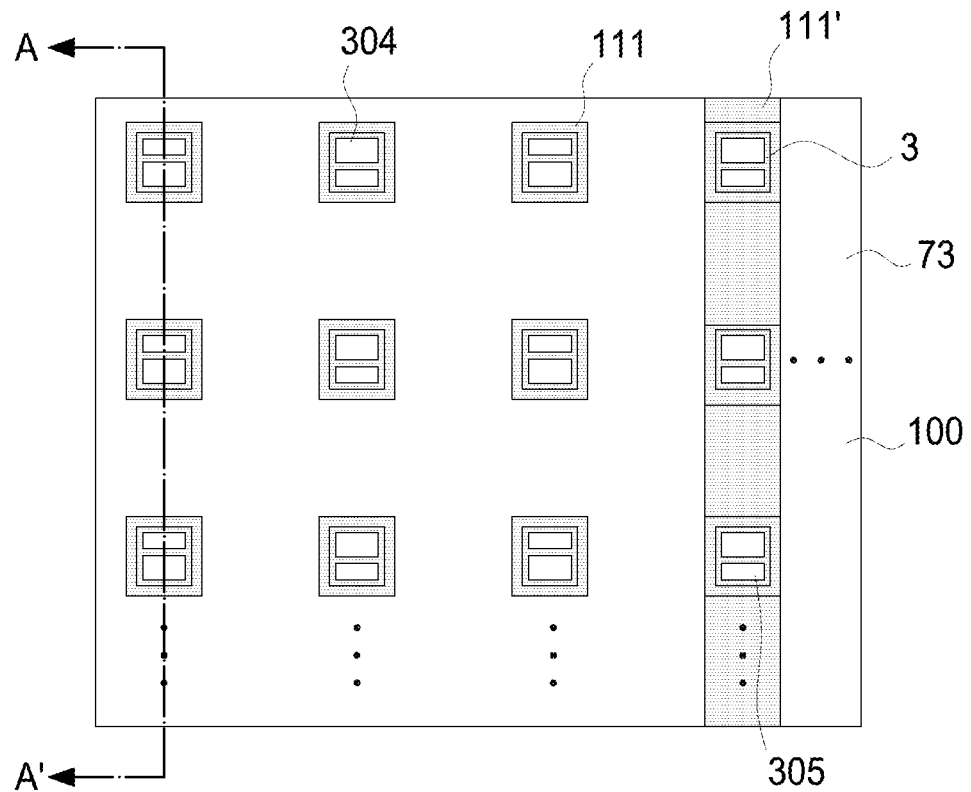
Figure 9B:
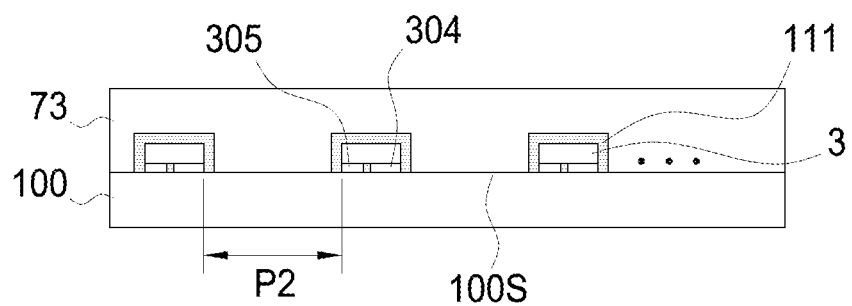

FIG. 9A illustrates a top view of optoelectronic units having a first electrode pad 304 and a second electrode pad 305 formed on a first supporting structure 73 in accordance with an embodiment of the present application. FIG. 9B illustrates a cross-sectional view along the line A-A' shown in FIG. 9A. The first supporting structure 73 can be made to have cavities configured to accommodate at least one of the optoelectronic units 3. The first supporting structure 73 covering the optoelectronic units 3 can hold and support the optoelectronic units 3 and enhance the mechanical strength of the optoelectronic units 3. The first supporting structure 73 can be a transparent structure made of one or more transparent materials. The transparent material can be made of one or more of organic material or inorganic material. The organic material is such as epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, or fluorocarbon polymer. The inorganic material is such as glass, $Al_2O_3$, SINR, or SOG. A wavelength converting layer 111 can be formed around each optoelectronic unit 3. In one embodiment, a wavelength converting layer 111' as shown in FIG. 9A can be formed in a stripe shape, around each optoelectronic unit 3, and on part of a surface 100s of the temporary carrier 100. In another embodiment, the wavelength converting layer can be formed around each optoelectronic unit 3 and on the whole top surface 100s of the temporary carrier 100.

Figure 10A:
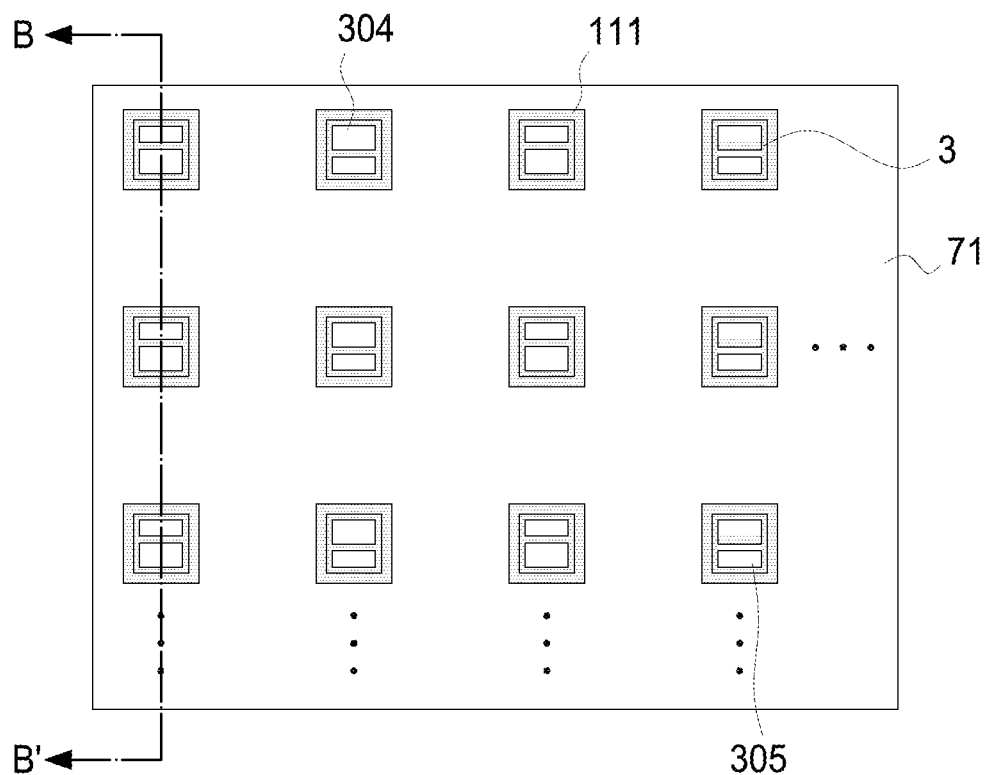
Figure 10B:
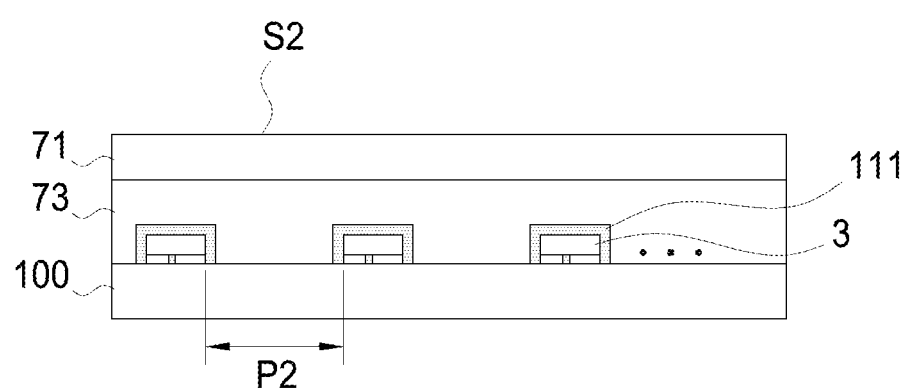
Figure 10C:
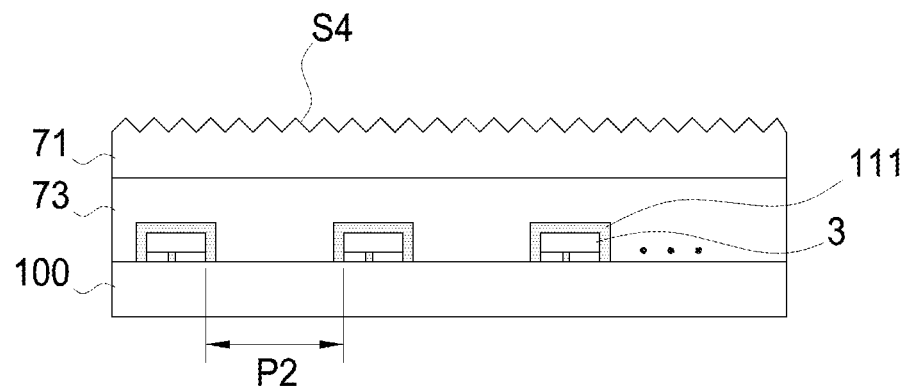
Figure 10D:
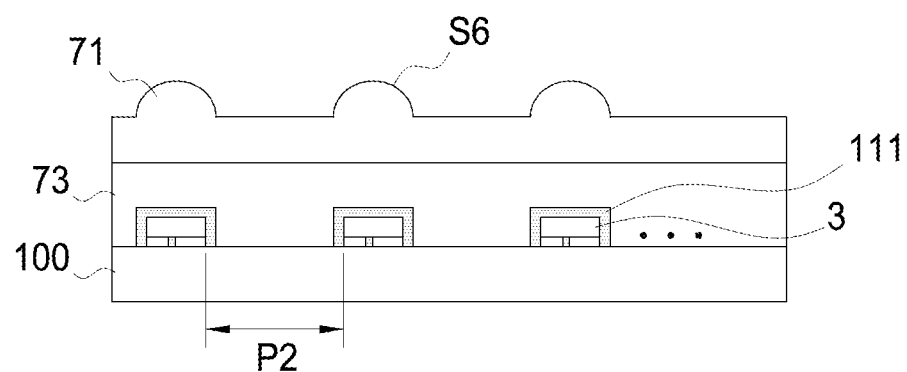

FIG. 10A illustrates a top view of several optoelectronic units 3 with a first electrode pad 304 and a second electrode pad 305 formed thereon further supported by a second supporting structure 71 in accordance with an embodiment of the present application. FIG. 10B illustrates a cross-sectional view along the line B-B' shown in FIG. 10A. The second supporting structure 71 can include one material different from that of the first supporting structure 73 or have hardness greater than that of the first supporting structure 73. The second supporting structure 71 can be made of one or more transparent materials, such as sapphire, diamond, glass, epoxy, quartz, acryl, $SiO_x$, $Al_2O_3$, ZnO, silicone, or any combination thereof. The second supporting structure 71 can be transparent to light like the sunlight or the light emitted from the optoelectronic units. A thickness of the second supporting structure 71 can be between 300 μm and 700 μm. In addition, a wavelength converting layer 111 is formed around each optoelectronic unit. At least one surface of the second supporting structure 71 is a flat surface, such as the surface S2 shown in FIG. 10B; or a rough surface, such as the surface S4 shown in FIG. 10C; or a curved surface S6 shown in FIG. 10D. The surface S4 of the second supporting structure 71 is a zigzag surface. The curved surface S6 of the second supporting structure 71 has several curved protrusions corresponding to the position of the optoelectronic devices for enhancing light extraction.

Figure 11A:
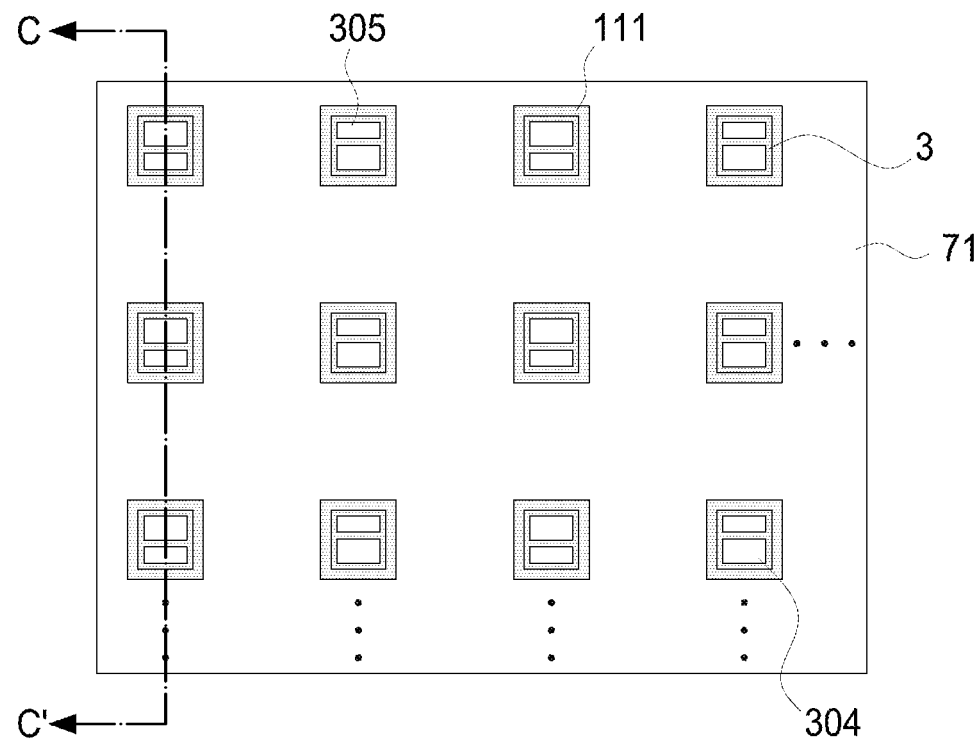
Figure 11B:
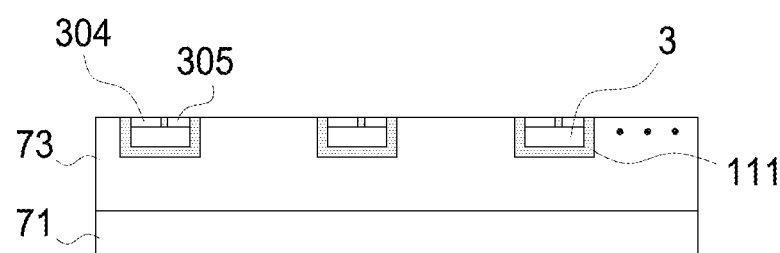

FIG. 11A illustrates a top view of several optoelectronic units supported by a second supporting structure 71 and a first supporting structure 73 in accordance with an embodiment of the present application. After the optoelectronic unit 3 is removed from a temporary carrier 100 shown in FIG. 10B to expose the bonding pads 104, 105 (or the extension pads 204, 205 or the electrode pads 304, 305), the second supporting structure 71 and the first supporting structure 73 are flipped. FIG. 11B illustrates a cross-sectional view along the line C-C' shown in FIG. 11A.

Figure 12A:
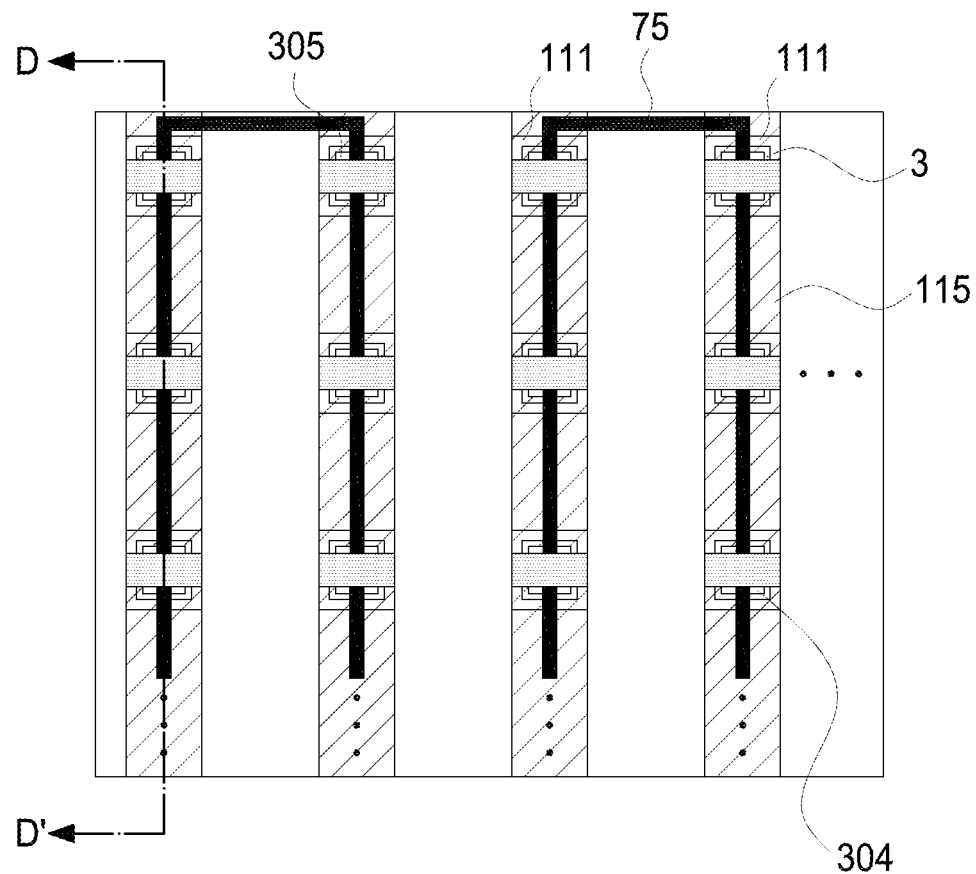
Figure 12B:
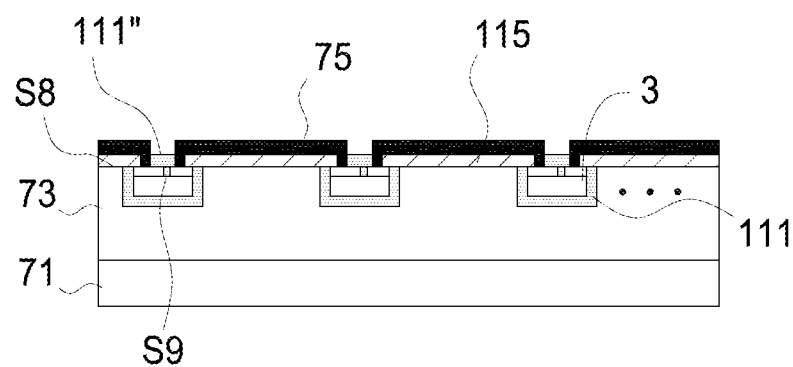
Figure 13A:
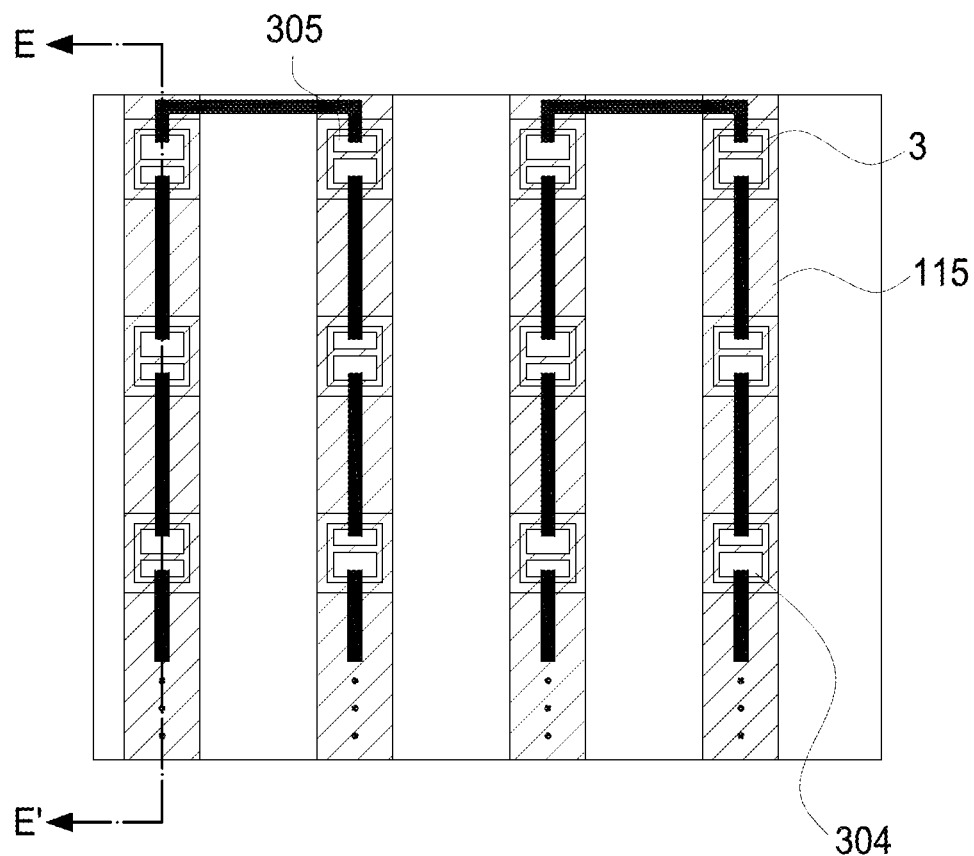
Figure 13B:
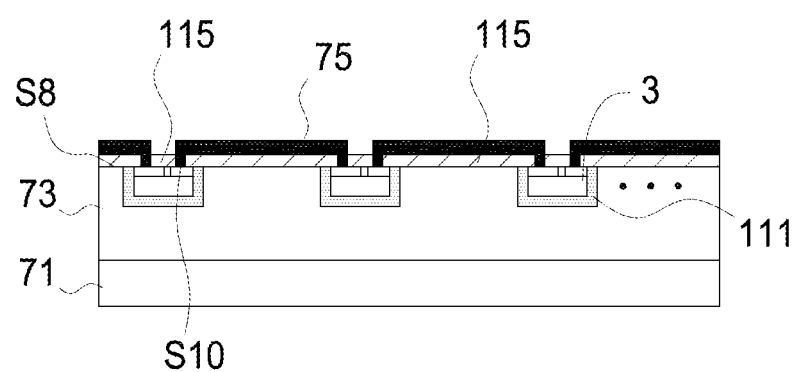

FIG. 12A and FIG. 13A illustrate top views of the optoelectronic units 3 electrically connected by a conductive element 75 in series through the bonding pads 104, 105 (or the extension pads 204, 205 or the electrode pads 304, 305). In accordance with another embodiment, the optoelectronic units 3 can be electrically connected by the conductive element 75 in parallel (not shown). FIG. 12B and FIG. 13B illustrate cross-sectional views along the line D-D' shown in FIG. 12A and the line E-E' shown in FIG. 13A, respectively. As shown in FIG. 12A and FIG. 13A, the conductive element 75 has a portion 751 arranged on the first supporting structure 73 between two of the optoelectronic units 3. A reflective layer 115 is formed on the optoelectronic unit 3 by lithography and an etching process. The reflective layer 115 can be made of one or more reflective materials, such as dielectrically material, for example, $SiO_2$, $Si_3N_4$, or metal oxide, such as titanium dioxide, or other white substance. In an example of the present application, the reflective layer 115 can be a single layer or a stack. FIGS. 12A-12B illustrate that a part of the surface S8 of the first supporting structure 73 is covered by the reflective layer 115, and a part of surface S9 of the first supporting structure 73 not covered by the reflective layer 115 is overlaid by a wavelength converting layer 111", and a part of surface S10 of the first supporting structure 73 not covered by the reflective layer 115 and the wavelength converting layer 111" is overlaid by the conductive element 75. The reflective layer 115 is formed on the first supporting structure 73 between two of the optoelectronic units 3. The materials of the wavelength converting layer 111" and the wavelength converting layer 111 can be the same or different. The material of the conductive element 75 includes one or more metals. The metal is such as Ag, Au, Ti or Cu.

FIGS. 13A-13B illustrate another embodiment that a part of the surface S8 of the first supporting structure 73 is covered by the reflective layer 115, and a part of surface S10 of the first supporting structure 73 not covered by the reflective layer 115 is overlaid by the conductive element 75.

Figure 14:
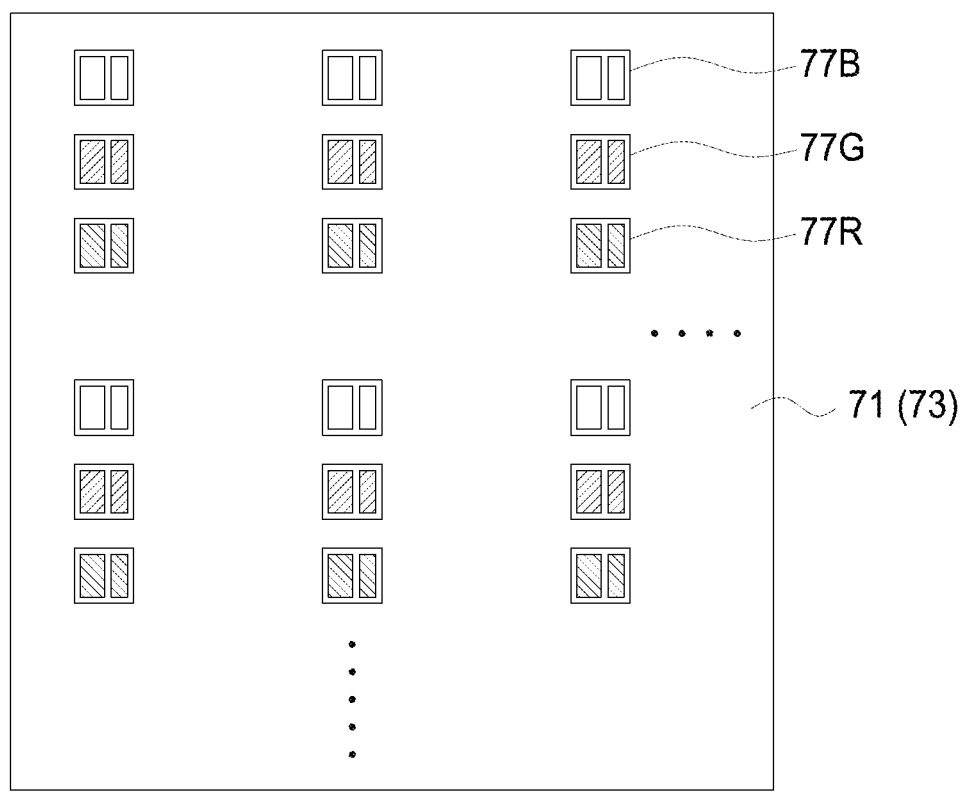
Figure 15A:
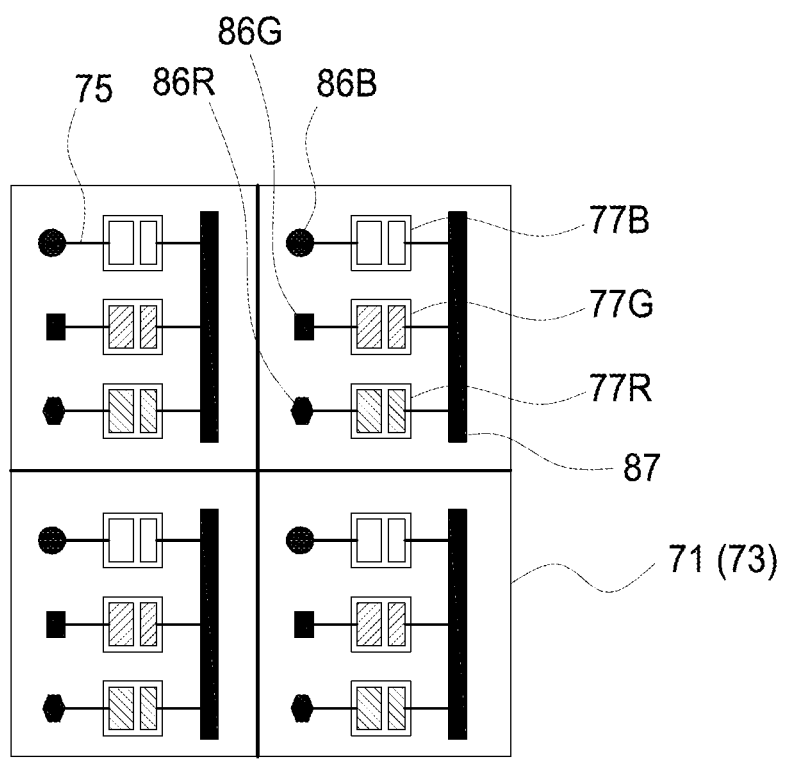
FIGS. 15A and 15B illustrate a encapsulated LED unit in accordance with an embodiment of the present application.
Figure 15B:
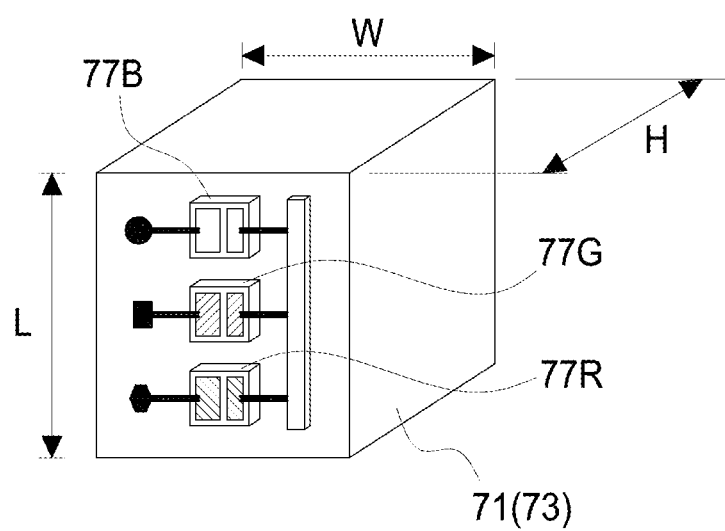

As shown in FIG. 14, the optoelectronic units 77B, 77R, 77G on the temporary carrier 100 are subject to the method illustrated in FIGS. 9A-10B such that the optoelectronic units 77B, 77R, 77G are supported by the second supporting structure 71 and the first supporting structure 73, and the bonding pads 104, 105 (or the extension pads 204, 205 or the electrode pads 304, 305) thereof are exposed. The conductive element 75 (not shown) is formed to electrically connect the optoelectronic units 77B, 77R, 77G with each other. In one embodiment, as shown in FIG. 15A, three terminals 86B, 86G and 86R including one or more metal materials are formed to electrically connected to the optoelectronic unit 77B, the optoelectronic unit 77G, and the optoelectronic unit 77R, respectively. A terminal 87 is further formed to be electrically connected to the optoelectronic units 77B, the optoelectronic units 77G, and the optoelectronic units 77R such that the optoelectronic units 77B, 77R, 77G are connected with each other in parallel. The forming method of the terminals 86B, 86G, 86R and 87 includes one step of electrical plating, chemical deposition and metal wiring. At least one of the terminals 86B, 86G, 86R and/or 87 can be made of metal such as Au, Ag, Ti, Cu, or any combination thereof. After defining the rows and columns of the array pattern, the plurality of optoelectronic units 77B, the optoelectronic units 77G, and the optoelectronic units 77R can be separated into encapsulated light-emitting units (hereinafter called encapsulated LED unit) arranged on the second supporting structure 71 and the first supporting structure 73, as shown in FIG. 15B. The encapsulated LED unit includes at least one optoelectronic unit 77B, at least one optoelectronic unit 77G, and at least one optoelectronic unit 77R, which are arranged in line. An encapsulated LED unit can be a pixel of a LED display module. Alternatively, several encapsulated LED units can be further mounted on a carrier, and interconnected to be a pixel of a LED display module (not shown).

Figure 16A:
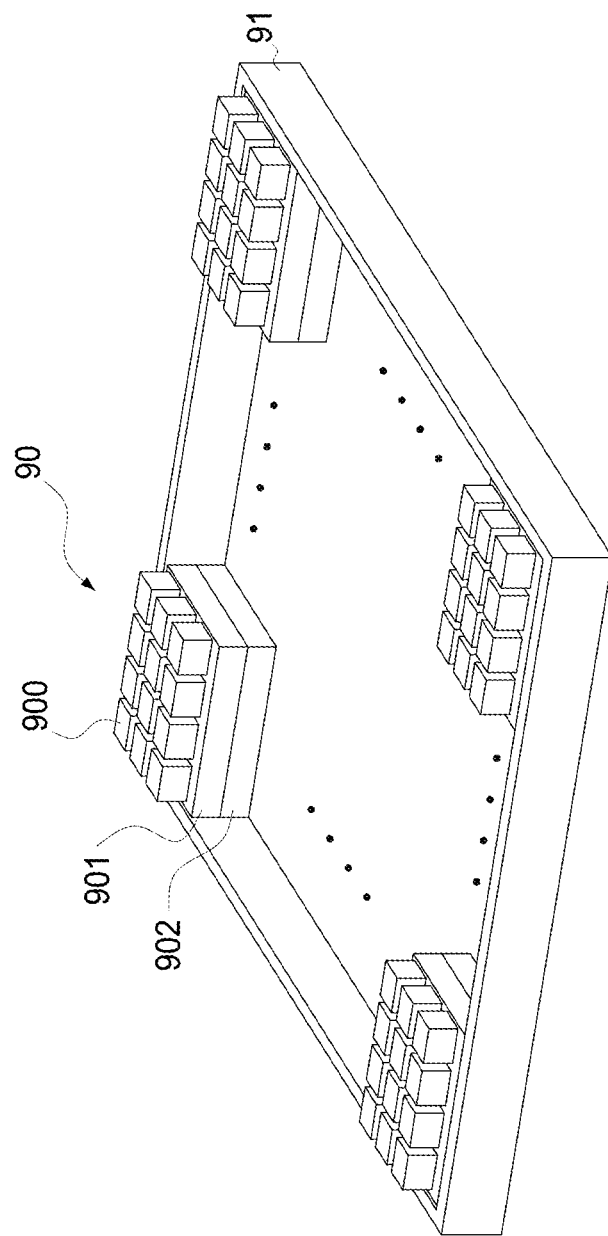
FIGS. 16A-16C illustrate a LED display module in accordance with an embodiment of the present application.
Figure 16B:
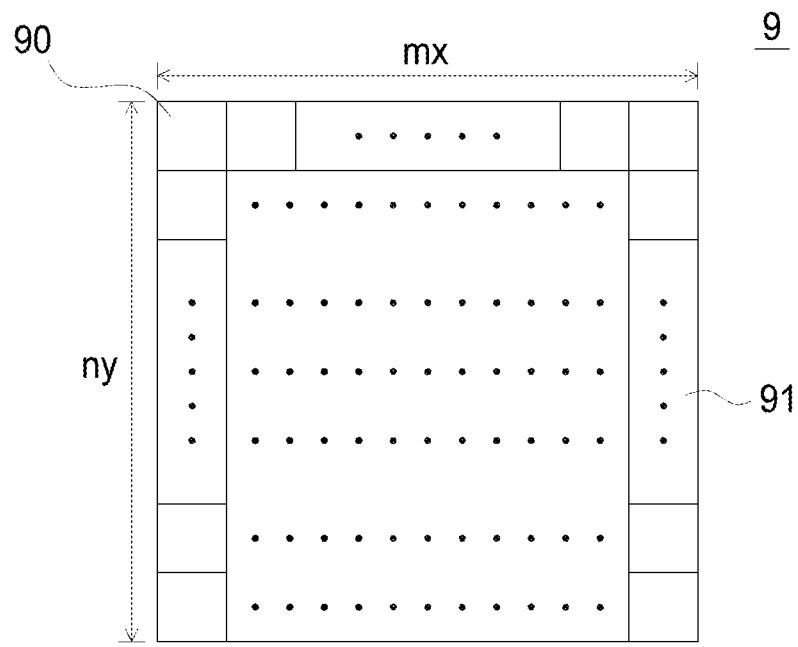
Figure 16C:
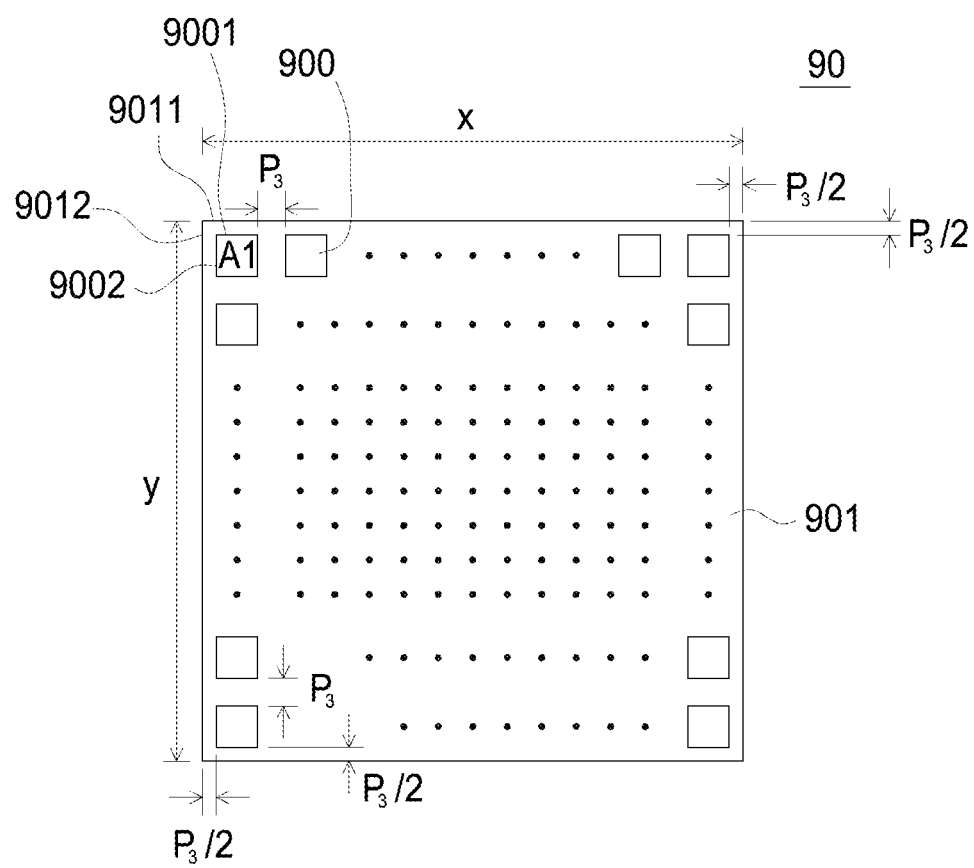

FIGS. 16A-16C illustrate a light-emitting display module 9 (hereinafter called LED display module) in accordance with one embodiment of the present application. FIG. 16A illustrates a perspective view of an LED display module 9. FIG. 16B illustrates a top view of the LED display module 9. FIG. 16C illustrates a top view of a light-emitting diode modules 90 (hereinafter called LED module). The LED display module 9 comprises a board 91 and a plurality of LED modules 90 mounted on the board 91. The LED module 90 is closely adjacent to one another; that is, no space exists between adjacent ones thereof. In this embodiment, each of the LED modules 90 is a rectangle having a length of x and a width of y. The LED display module 9 has m number of LED modules 90 in length and n number of LED modules 90 in width so the LED display module 9 is a rectangle having a length (m*x) and a width (n*y); wherein m, and n are positive integers; mx:ny=16:9 or 4:3; m:n=4:3 or 16:9.

As shown in FIGS. 16A-16C and FIG. 17, the LED module 90 comprise a first submount 901, a second submount 902 on which the first submount 901 is disposed, and a plurality of encapsulated LED units 900 disposed on the first submount 901. The encapsulated LED units 900 are spaced apart from each other with a first distance $P_3$, and the encapsulated LED units 900 at the both ends of each row and column of the first submount 901 are spaced apart from the corresponding edges of the first submount 901 by a second distance $P_3/2$; wherein $P_3 \leq 0.6$ mm. For example, the encapsulated LED unit A1 has a first side 9001 and a second side 9002, and the first submount 901 has a first edge 9011 and a second edge 9012. The distance between the first side 9001 and the first edge 9011 is $P_3/2$ and the distance between the second side 9002 and the second edge 9012 is also $P_3/2$. In one embodiment, the encapsulated LED unit is a square having a length (l) equal to the first distance ($P_3$), that is, a ratio of the length of the encapsulated LED unit to the space (the first distance) between the encapsulated LED units is about 1:1 for a desired design. The LED display module 9 has a resolution a*b. It is noted that when the LED display module 9 is a rectangle having a diagonal (L) and the ratio of the resolution is a:b=16:9 (for example, the resolution is 1920*1080), the length (l) in inch is not greater than (0.435*L)/a or (0.245*L)/b. When the LED display module 9 is a rectangle having a diagonal (L) and the ratio of the resolution is a:b=4:3 (for example, the resolution is 1920*1440), the length (l) in inch is not greater than (0.4*L)/a or (0.3*L)/b. In one embodiment, a sum (S) of the length (l) and the first distance ($P_3$) in inch is not greater than (0.87*L)/a or (0.49*L)/b when the ratio of the resolution is a:b=16:9. Alternatively, a sum (S) of the length (l) and the first distance ($P_3$), in inch is not greater than (0.8*L)/a or (0.6*L)/b when the ratio of the resolution is a:b=4:3. The length (l) is smaller than or equal to the sum (S).

Figure 17:
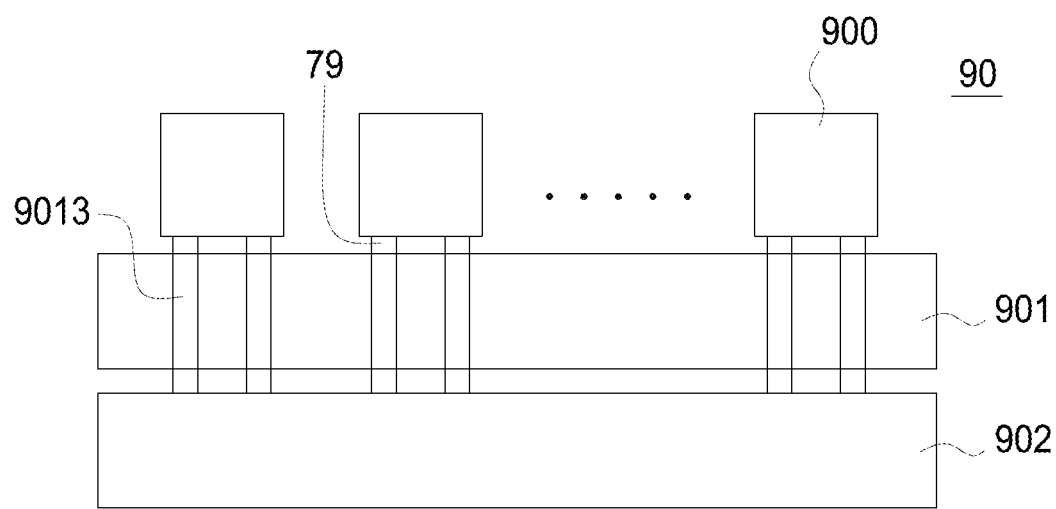
FIG. 17 illustrate a cross-section view of a LED modules in accordance with an embodiment of the present application.

FIG. 17 illustrates a cross-sectional view of one of the LED modules 90. Specifically, the first submount 901 comprises a plurality of metal lines 9013 formed therein for electrically connected with the encapsulated LED unit 900. The second submount 902 has electrical circuits (not shown) for electrically connected with the metal lines 9013 of the first submount 901. In addition, an integrated circuit can be embedded with in the second submount 902 for controlling an electrical operation of the encapsulated LED units 900 through the metal lines 9013. The first and second submounts 901, 902 can comprise thermoplastic material, thermosetting material or ceramic material. The thermoplastic material comprises polyimide resin or polytetrafluorethylene. The thermosetting material comprises epoxy, bismaleimide triazine (BT), or combinations thereof. The ceramic material comprises $Al_2O_3$, AlN, or AlSiC.

Figure 18A:
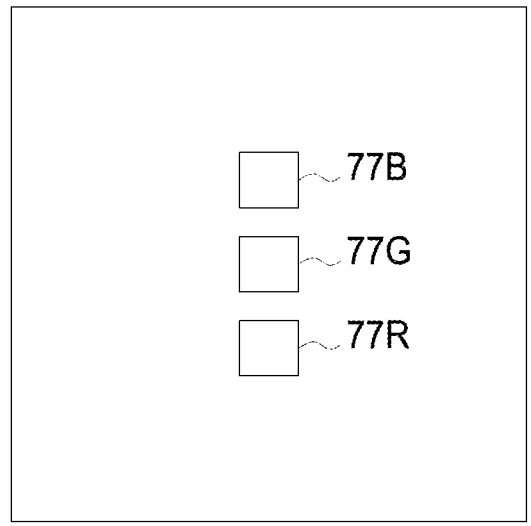
FIGS. 18A and 18B are showing top views of a encapsulated LED unit in accordance with an embodiment of the present application.
Figure 18B:
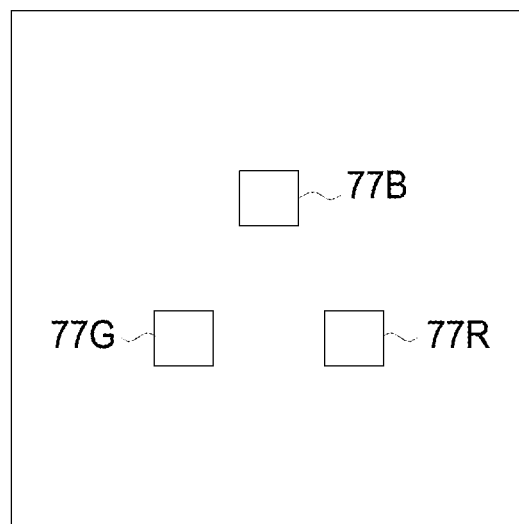
Figure 18C:
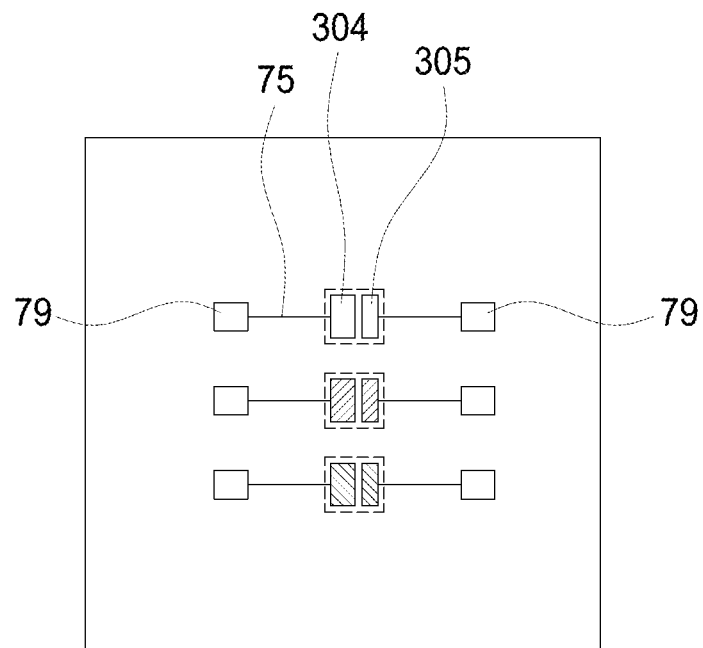
FIGS. 18C and 18D are showing bottom views of the encapsulated LED unit in accordance with an embodiment of the present application.
Figure 18D:
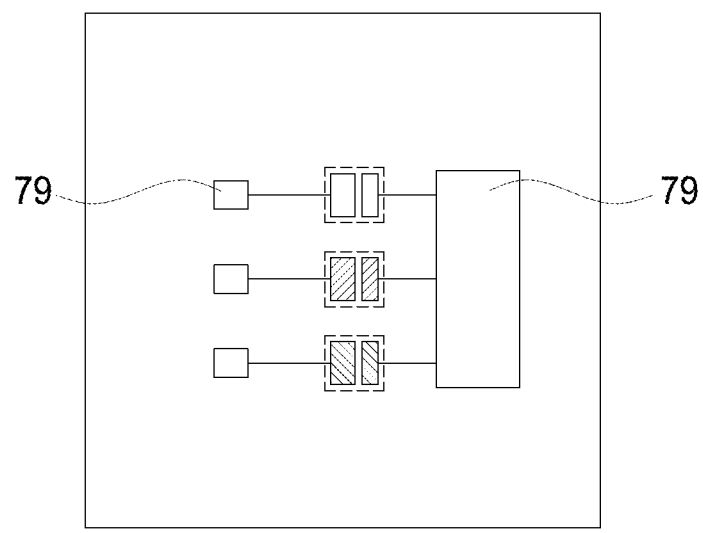
Figure 18E:
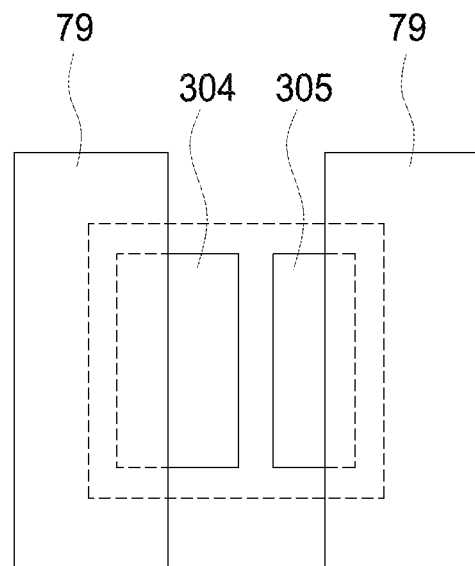
FIGS. 18E and 18F are showing bottom views of the encapsulated LED unit in accordance with another embodiment of the present application.
Figure 18F:
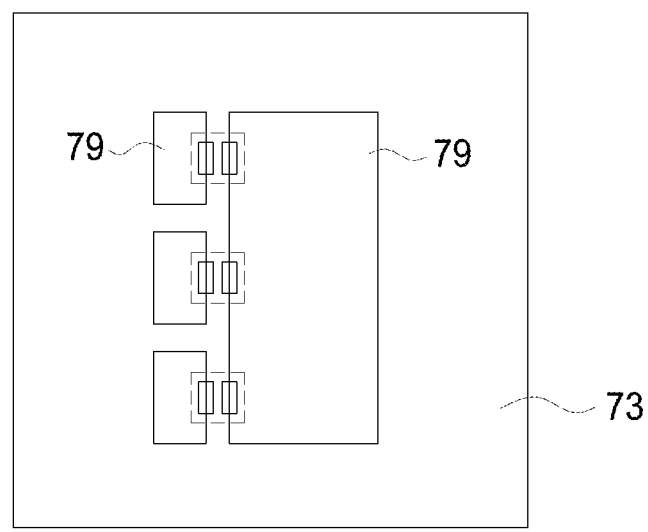

FIGS. 18A and 18B are showing top views of one of the encapsulated LED unit 900. The encapsulated LED unit 900 includes a fence 92 (as shown in FIGS. 19A-19D) which is not transparent and optoelectronic units 77B, 77G, and 77R which are arranged in line within the fence 92. Alternatively, the encapsulated LED units 900 can be arranged in a triangular form as shown in FIG. 18B. It is noted that one of the encapsulated LED unit can comprise a plurality of optoelectronic units 77B, 77R, 77G depending on the actual requirements and arranged in a desired form. FIGS. 18C and 18D are showing bottom views of the encapsulated LED unit 900. The encapsulated LED unit 900 further comprises a plurality of pins 79 formed on the first supporting structure 73' opposite to the second supporting structure 71' (as shown in FIG. 19D) and electrically connected with the optoelectronic units 77R, 77G, 77B through a conductive element and with the metal lines 9013 (as shown in FIG. 17D) in the first submount 901. As shown in FIG. 18C, there are three pairs (positive electrode and negative electrode) of pins 79 respectively connected with the optoelectronic units 77R, 77G, 77B. As shown in FIG. 18D, there can be four pins 79 (one is common negative electrode and three are positive electrodes; or one is common positive electrode and three are negative electrodes). In FIGS. 18C and 18D, the pins 79 are electrically connected with the electrode pads 304, 305 of the optoelectronic units 77R, 77G, 77B through the conductive element 75'. As shown in FIGS. 18E and 18F, the pins can be electrically connected with the optoelectronic units by partly overlapping the electrode pads 304, 305 (the bonding pads 104, 105, or the extension pads 204, 205) or fully overlapping the bonding pads 104, 105 (or the extension pads 204, 205 or the electrode pads 304, 305)(not shown). Compared with the commercial encapsulated LED unit having a size of 1.0 mm×1.0 mm×0.2 mm, the encapsulated LED unit 900 disclosed in this embodiment can have a size (volume) less than 0.1 mm³ by using the optoelectronic unit 1, 2 or 3, and the manufacturing method described above. In this embodiment, the encapsulated LED unit 9 has a size of 0.5 mm×0.5 mm×0.2 mm. With the encapsulated LED unit 9, the LED display module 9 having higher LED package density is provided.

Figure 19A:
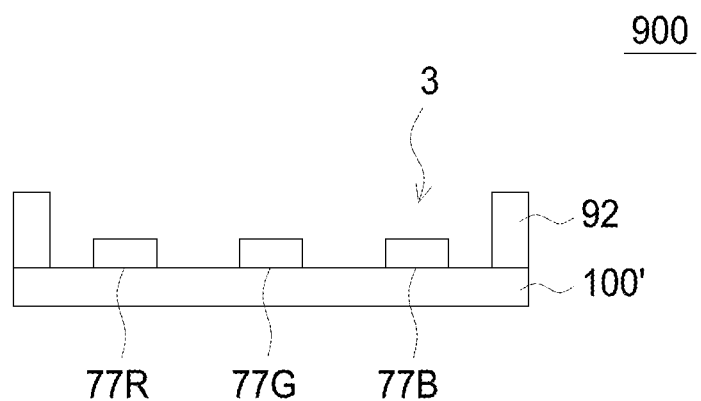
FIGS. 19A-19D are showing steps of manufacturing a encapsulated LED unit embodied in a LED display module in accordance with an embodiment of the present application.
Figure 19B:
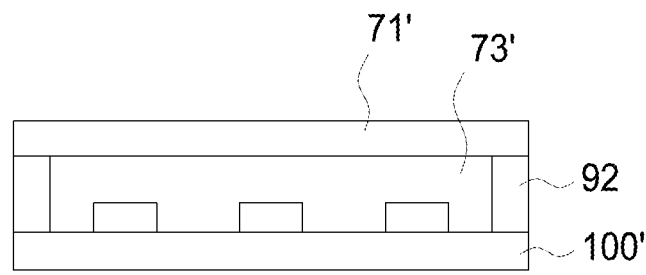
Figure 19C:
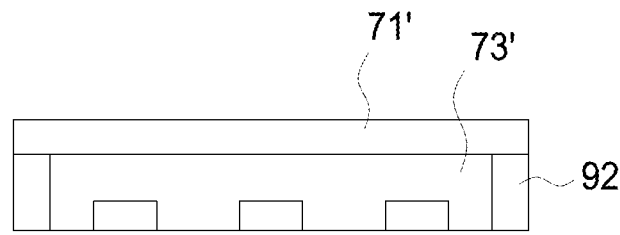
Figure 19D:
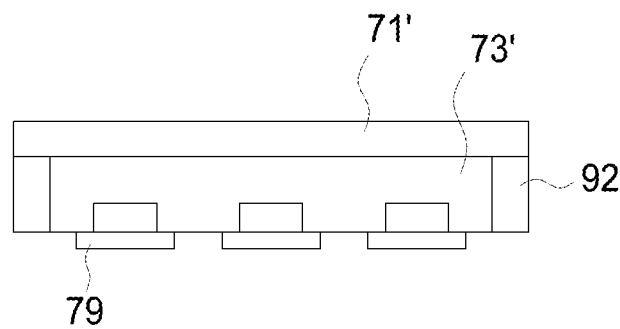

FIGS. 19A-19D illustrate steps of manufacturing a encapsulated LED unit 900 embodied in the LED display module 9. As shown in FIG. 19A, the optoelectronic units (1, 2 or/and 3) are arranged on the temporary carrier 100' and surrounded by a fence 92. As shown in FIG. 19B, a first supporting structure 73' formed on the optoelectronic units can be made of one or more transparent materials. The transparent material can be made of one or more of organic material and inorganic material. The organic material is such as epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, and/or fluorocarbon polymer. The inorganic material is such as glass, $Al_2O_3$, SINR, and/or SOG. The second supporting structure 71' is formed to support the first supporting structure 73' and can include at least one material different from that of the first supporting structure 73', or have hardness greater than that of the first supporting structure 73'. The second supporting structure 71' can be made of one or more transparent materials, such as sapphire, diamond, glass, epoxy, quartz, acryl, $SiO_x$, $Al_2O_3$, ZnO, silicone, and/or any combination thereof. In addition, the second supporting structure 71' can also be transparent to light, like the sunlight. A thickness of the second supporting structure 71' can be between 100 μm and 700 μm. As shown in FIG. 19C, the temporary carrier 100' is removed. As shown in FIG. 19D, the pins 79 are formed on the first supporting structure 73' opposite to the second supporting structure 71' for electrically connecting with the metal lines 9013 (as show in FIG. 17) in the first submount 901. In this embodiment, the encapsulated LED unit 900 comprises a red optoelectronic unit 77R emitting red light, a green optoelectronic unit 77G emitting green light, a blue optoelectronic unit 77B emitting blue light. The fence 92 is configured to absorb light and comprises a non-transparent material, such as a plastic with a black coating thereon or a plastic mixed with a black coating to form an integrated structure. The plastic comprises silicone, epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, polyurethane (PU), or polydimethylsiloxane (PDMS).

It is noted that the LED display module is conventionally used in visual display applications, such as billboards and stadium scoreboards, etc. The LED display module includes a general rectangular array of encapsulated LED unit as pixels. Each encapsulated LED unit includes a plurality of LEDs positioned in a desired arrangement. The number, color and placement of LEDs within a encapsulated LED unit, together with the pitch among the encapsulated LED units, affect the various visual characteristics of the pixel array. The smaller the encapsulated LED unit is, the higher resolution can be reached.

The embodiments mentioned above are used to describe the technical thinking and the characteristic of the invention and to make the person with ordinary skill in the art to realize the content of the invention and to practice, which could not be used to limit the claim scope of the present invention. That is, any modification or variation according to the spirit of the present invention should also be covered in the claim scope of the present disclosure. For example, the electric connecting method is not limited to the serial connection.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting module, comprising:
   a first optoelectronic unit having a first electrode pad and a second electrode pad;
   a second optoelectronic unit having a third electrode pad and a fourth electrode pad;
   a first supporting structure enclosing the first optoelectronic unit and the second optoelectronic unit;
   a first pin overlapping and confronted with both of the first electrode pad and the third electrode pad;
   a second pin overlapping the second electrode pad and the first supporting structure; and
   a third pin overlapping the fourth electrode pad and physically separated from the second pin.

2. The light-emitting module of claim 1, wherein the second pin has a width larger than that of the second electrode pad.

3. The light-emitting module of claim 1, further comprising a conductive structure electrically connected to the first pin and the first electrode pad.

4. The light-emitting module of claim 3, wherein the conductive structure is arranged between the first pin and the first electrode pad.

5. The light-emitting module of claim 3, wherein the conductive structure has a width larger than that of the first electrode pad.

6. The light-emitting module of claim 3, wherein the first supporting structure is arranged to expose at least part of the conductive structure.

7. The light-emitting module of claim 1, further comprising a first submount supporting the first pin, the second pin, and the third pin.

8. The light-emitting module of claim 1, further comprising a second supporting structure covering the first optoelectronic unit, the second optoelectronic unit, and the first supporting structure.

9. The light-emitting module of claim 8, wherein the second supporting structure is transparent to light.

10. The light-emitting module of claim 8, wherein the second supporting structure and the first pin are arranged on opposite sides of the first supporting structure.

11. The light-emitting module of claim 8, wherein the second supporting structure has an uneven surface.

12. The light-emitting module of claim 8, wherein the second supporting structure has a zigzag surface.

13. The light-emitting module of claim 1, wherein the first supporting structure is arranged to cover a top surface of the first optoelectronic unit and expose a bottom surface of the first optoelectronic unit.

14. The light-emitting module of claim 1, further comprising a third optoelectronic unit enclosed by the first supporting structure.

15. The light-emitting module of claim 14, wherein the first optoelectronic unit, the second optoelectronic unit, and the third optoelectronic unit are arranged in a linear pattern.

16. The light-emitting module of claim 1, wherein the first optoelectronic unit, the second optoelectronic unit, and the third optoelectronic unit are configured to emit different color lights.

17. The light-emitting module of claim 1, wherein the first pin is electrically connected to the first optoelectronic unit and the second optoelectronic unit.

18. The light-emitting module of claim 1, wherein the first optoelectronic unit has a longer side and a shorter side in a top view, the first pin is extended along the shorter side to stride over the second optoelectronic unit.

19. The light-emitting module of claim 18, wherein second pin and the third pin are arranged in a linear pattern along another shorter side of the first optoelectronic unit in the top view.

20. A display module, comprising:
- a substrate; and
- a plurality of light-emitting modules of claim 1 arranged on the substrate.

* * * * *